United States Patent
Ananthan et al.

(10) Patent No.: US 8,716,115 B2
(45) Date of Patent: May 6, 2014

(54) HIGH PRODUCTIVITY COMBINATORIAL DUAL SHADOW MASK DESIGN

(75) Inventors: Venkat Ananthan, Cupertino, CA (US); Prashant B. Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 110 days.

(21) Appl. No.: 13/275,822

(22) Filed: Oct. 18, 2011

(65) Prior Publication Data
US 2013/0093049 A1    Apr. 18, 2013

(51) Int. Cl.
*H01L 27/32* (2006.01)

(52) U.S. Cl.
CPC .................................. *H01L 27/3295* (2013.01)
USPC .......................................... 438/531; 438/396

(58) Field of Classification Search
CPC ..................... H01L 27/3295; H01L 27/10852; H01L 28/91; H01L 28/40
USPC .......... 438/381, 396, 460; 257/531, 532, 944, 257/E21.008, E29.342
See application file for complete search history.

(56) References Cited

U.S. PATENT DOCUMENTS

| | | | | |
|---|---|---|---|---|
| 4,919,076 A * | 4/1990 | Lutz et al. | | 118/721 |
| 6,004,617 A * | 12/1999 | Schultz et al. | | 506/15 |
| 6,359,234 B1 * | 3/2002 | Kouda | | 174/260 |
| 6,368,514 B1 | 4/2002 | Metzler | | |
| 6,996,550 B2 | 2/2006 | Wang et al. | | |
| 7,045,384 B1 | 5/2006 | Pan et al. | | |
| 7,544,574 B2 | 6/2009 | Chiang et al. | | |
| 7,824,935 B2 * | 11/2010 | Verma et al. | | 438/18 |
| 7,871,928 B2 | 1/2011 | Chiang et al. | | |
| 7,902,063 B2 | 3/2011 | Chiang et al. | | |
| 7,947,531 B1 | 5/2011 | Chiang | | |
| 7,975,371 B2 | 7/2011 | Ha | | |
| 8,084,400 B2 | 12/2011 | Chiang et al. | | |
| 2002/0152057 A1 * | 10/2002 | Wang et al. | | 703/6 |
| 2008/0165468 A1 * | 7/2008 | Berolini et al. | | 361/306.3 |
| 2009/0001514 A1 * | 1/2009 | Bae | | 257/532 |
| 2009/0269901 A1 * | 10/2009 | Naito | | 438/393 |
| 2010/0163404 A1 * | 7/2010 | De et al. | | 204/192.12 |
| 2011/0181999 A1 * | 7/2011 | Ha | | 361/311 |
| 2011/0250730 A1 * | 10/2011 | Hopper et al. | | 438/396 |

OTHER PUBLICATIONS

Komaki, H., et al.; Fabrication of integrated CIGS modules using the inline threestage process; National Institute of Advanced Industrial Science and Technology (AIST), presented May 11-16, 2008.
U.S. Appl. No. 11/419,174, filed May 18, 2006.
U.S. Appl. No. 11/674,132, filed Feb. 12, 2007.
U.S. Appl. No. 11/674,137, filed Feb. 12, 2007.

* cited by examiner

*Primary Examiner* — Tom Thomas
*Assistant Examiner* — John Bodnar

(57) ABSTRACT

Dual shadow mask design can overcome the size and resolution limitations of shadow masks to provide capacitor structures with small effective areas. The capacitor structures have bottom and top electrode layers patterned using shadow masks, sandwiching a dielectric layer. The effective areas of the capacitors are the overlapping areas of the top and bottom electrodes, thus allowing small area sizes without subjected to the size limitation of the electrodes. The dual shadow mask design can be used in conjunction with high productivity combinatorial processes for screening and optimizing dielectric materials and fabrication processes.

12 Claims, 17 Drawing Sheets

HIGH PRODUCTIVITY COMBINATORIAL DUAL SHADOW MASK DESIGN

FIELD OF THE INVENTION

The present invention relates generally to dielectric testing and particularly to capacitor structures fabricated using shadow mask designs.

BACKGROUND OF THE INVENTION

Deposition processes are commonly used in semiconductor manufacturing to deposit a layer of material onto a substrate. Processing is also used to remove layers, defining features (e.g., etch), preparing layers (e.g., cleans), doping or other processes that do not require the formation of a layer on the substrate. Processes and process shall be used throughout the application to refer to these and other possible known processes used for semiconductor manufacturing and any reference to a specific process should be read in the context of these other possible processes. In addition, similar processing techniques may apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct research and development (R&D) on full wafer processing through the use of split lots, as the deposition systems are designed to support this processing scheme. This approach has resulted in ever escalating R&D costs and the inability to conduct extensive experimentation in a timely and cost effective manner.

Simpler processing methods for simple device structures can be employed in R&D for large scale screening of materials and process conditions. For example, shadow mask deposition is well-known and has been used for years in microelectronics capacitor device fabrication for electrical testing of dielectrics. The shadow mask deposition process is much simpler and more cost effective than the other patterning process of photolithography.

To create a capacitor electrode pattern on a substrate, a shadow mask is placed over the substrate surface. The substrate with the shadow mask is then subjected to a deposition process of a conductive material. The substrate areas corresponding to the aperture openings of the shadow mask receive a deposition coating while other areas are shielded by the shadow mask. To achieve vertical deposition profiles, the shadow mask is preferably thin and forms intimate contact with the substrate surface during the deposition process.

One major limitation of shadow mask deposition process is the lack of sufficiently resolution to meet today's demands. For example, shadow mask processes with apertures smaller than 50 microns are difficult due to potential mask and deposition defects, together with probing difficulties. Large area electrodes fabricated with shadow mask processes can lead to high leakage current and low yield for thin dielectrics to obtain meaningful trends for optimization. This requires the use of dielectrics in a thicker range that is far away from production-worthy processes. As a result, costly photolithography manufacturing techniques continue to be utilized to produce such high resolution products.

Hence, there is a need to improve the resolutions of the devices fabricated with shadow masks without reducing the size of the shadow mask openings.

SUMMARY OF THE DESCRIPTION

In some embodiments, the present invention discloses a dual shadow mask design to achieve capacitor structures with small effective areas. The capacitor structures can comprise a bottom and a top electrode patterned layers sandwiching a dielectric layer. The effective areas of the capacitors are the overlapping areas of the top and bottom electrodes, thus allowing small area sizes without subjected to the size limitation of the electrodes. The electrode patterned layers can be formed from shadow masks, allowing simple and cost effective device fabrication processes, for example, avoiding the time-consuming and costly lithography patterning process.

An advantage of the present dual shadow mask design is that the overlapped areas between the top and bottom electrodes can be smaller than either the top or the bottom electrode area. In general, shadow mask deposition is a simple and fast fabrication technique to form electrodes for capacitor structures. However, a major limitation of shadow mask process is the electrode size, which cannot be too small due to both deposition and testing conditions. The current limit for the size of the opening apertures in a shadow mask is about 50 microns.

The present dual shadow mask can produce capacitor structures having effective capacitance areas of a few microns square or less, fabricated by using a top shadow mask having a pattern that overlaps that of a bottom shadow mask by the desired areas. In addition, since the capacitor structures are defined by the overlap areas, the size limitations of the shadow mask can be greatly reduced, leading to simpler shadow masks with better performance.

In some embodiments, the capacitor structures comprise multiple different sizes, allowing testing for dielectric performance and process conditions, such as separating the inherent dielectric behaviors with the fabrication defect densities.

In some embodiments, a same shadow mask, or different shadow masks having a same aperture pattern, can be used for both depositions of top and bottom electrode layers. By shifting the top electrode pattern with respect to the bottom electrode pattern, different overlap areas can be realized. In addition, the shadow mask pattern can be designed so that multiple different overlap areas can be present for a single pattern shift.

In some embodiments, the top electrode pattern can comprise probe test patterns to facilitate automatic testing, for example, using probe cards having arrays of probes arranged in close proximity to each other. The probe test pattern can have similar and periodic arrangements for probing areas, while the capacitor structures connected to the probe test pattern can have any desired effective area.

In some embodiments, the present invention discloses fabrication methods to form capacitor structures on a substrate with effective capacitance areas not limited by the shadow mask design. By forming two electrodes patterned layers sandwiching a dielectric layer, simple and cost effective capacitor structures can be fabricated with capacitance areas in the micron ranges, for example, less than 10 or 5 microns.

In some embodiments, the present invention discloses high productivity combinatory processes for screening and optimizing dielectric materials and fabrication processes. Large matrix screening can be performed through multiple isolated regions on a single wafer. The multiple isolated regions can be fabricated with multiple dielectric materials and process conditions, together with multiple micron-size capacitor structures.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to dielectric testing, for example, to obtain optimum process and material conditions to achieve a desired performance. The tests can comprise effective dielectric constant measurement, effective dielectric thickness equivalent to silicon dioxide, and reliability data such as leakage current or means time to fail. In some embodiments, the present invention discloses methods and systems for use in high productivity combinatorial processes.

The present invention also relates to testing structures and fabrication processes, for example, capacitor structures to enable electrical testing for dielectric performance, and capacitor fabrication processes to enable economical device fabrication for electrical testing. The capacitor structures can be metal-insulator-metal capacitors (MIMCAPs), which can be used to evaluate high-k dielectrics for semiconductor and non-semiconductor applications.

The present invention further relates to shadow masks, which represent a simple and fast deposition technique to fabricate capacitor structures ready for electrical testing. In shadow mask processes, a shadow mask is positioned contacting a substrate surface before subjecting the substrate with the shadow mask to a deposition source. Material from the deposition source is deposited onto the substrate surface through apertures in the shadow mask, transferring the pattern of the shadow mask onto the substrate.

Figure 1A:
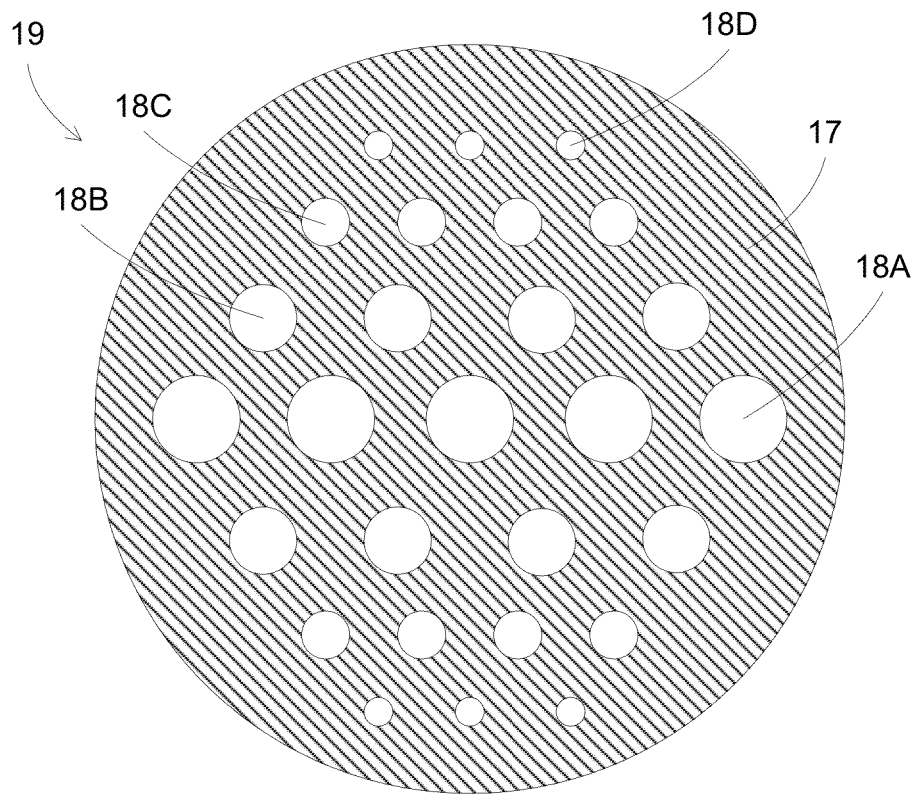
FIG. 1A illustrates an exemplary shadow mask according to some embodiments of the present invention.

FIG. 1A illustrates an exemplary shadow mask according to some embodiments of the present invention. A shadow mask 19 comprises a thin sheet of material 17, such as stainless steel. The shadow mask is preferably thin to improve deposition efficiency. The shadow mask is also preferably rigid to enable intimate contact with the whole substrate surface. Composite or multilayer shadow mask can be used, comprising thin masking portions mounted on thick solid support frame.

The shadow mask sheet 17 comprises a plurality of apertures 18A-18D, preferably of different sizes to enable testing of size dependency. As shown, the apertures 18A-18D have circular shape for ease of mask fabrication and device processing, but other shapes, such as square or rectangle, can be used. By mounting the shadow mask 17 in intimate contact with a substrate surface, the deposition material deposits on the shadow mask sheet 17, and on substrate through the apertures 18A-18D.

Figure 1B:
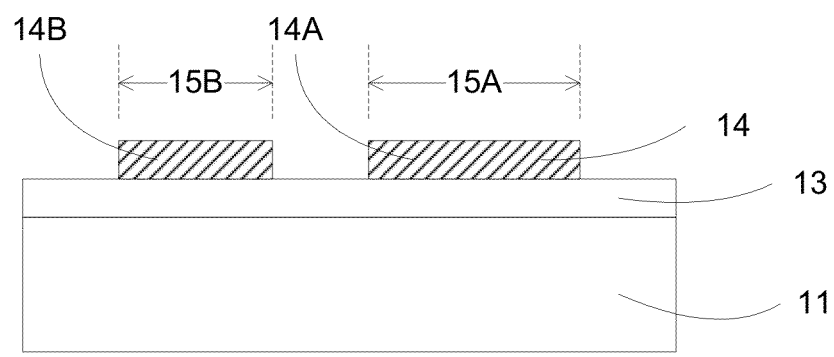
FIG. 1B illustrates an exemplary substrate having capacitor structures fabricated through shadow mask deposition according to some embodiments of the present invention.

FIG. 1B illustrates an exemplary substrate having capacitor structures fabricated through shadow mask deposition according to some embodiments of the present invention. A semiconductor substrate 11 comprising a dielectric layer 13 deposited thereon is subjected to a shadow mask deposition process, forming a patterned electrode layer 14 on the dielectric layer 13. The patterned electrode layer 14 comprises a plurality of electrodes 14A, 14B, which correspond to the apertures in the shadow mask. For example, electrodes 14A and 14B with dimensions 15A and 15B can correspond to apertures 18A and 18B, respectively, of shadow mask 19.

The electrode material is preferably metal, such as aluminum or tungsten, forming MOS (Metal Oxide Semiconductor) capacitor structures having a dielectric layer 13 sandwiched between a metal electrode layer 14 and a semiconductor substrate 11. The MOC capacitors can be electrically tested, such as leakage current or means time to fail under bias stress conditions, for measuring the performance of the dielectric material.

The testing data can be highly dependent on the areas of the electrodes. For example, for thinner with higher defect density dielectric layers, large electrode area devices can all exhibit highly leakage currents. This poses difficulty for optimization, e.g., through comparison between dielectric layers having similar leakage currents using large area electrodes.

For example, new dielectric materials are tested for potential applications as high-k dielectrics for Dynamic Random Access Memory (DRAM) and Resistive Random Access Memory (ReRAM). During initial screening of dielectric materials using conditions suitable for production-worthy processing, such as thin dielectric layers having thickness in the range of a few nanometers, the leakage current through these dielectrics may be too high or the yield too low to enable statistically significant comparison. This requires thicker dielectric layers, which can prohibit actual device performance optimizations, or smaller electrode areas, which can be very difficult or impossible with current shadow mask technology where the current limitation for the size of the apertures in a shadow mask is about 50 microns.

In some embodiments, the present invention discloses methods and systems for shadow mask usages with small device areas, which can be in the range of a few square microns or smaller. The present shadow mask usages can provide a cost effective fabrication process with reduced leakage and improved yield for optimizing dielectric materials and process conditions suitable for advanced device processing.

In some embodiments, the present invention discloses dual shadow mask processing, for example, to generate devices with smaller effective electrode areas. By sandwiching a dielectric layer between two shadow mask electrodes, the effective capacitor areas depend only on the overlapping portions of the two electrodes, and not on the individual sizes of the electrodes. Smaller effective device areas can be achieved, even with the current shadow mask limitations.

Figure 2A:
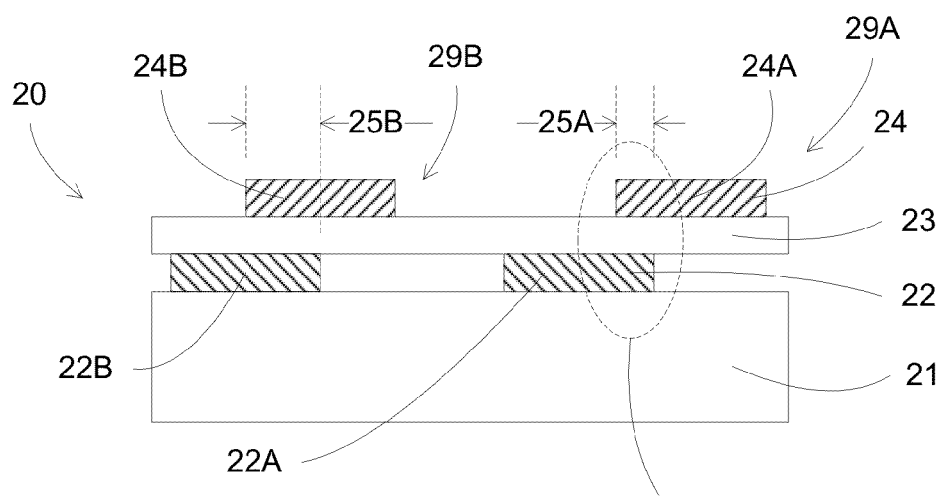
FIGS. 2A-2C illustrate exemplary dual shadow mask structures according to some embodiments of the present invention.
Figure 2B:
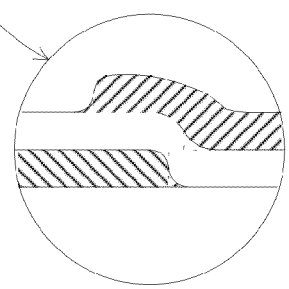
Figure 2C:
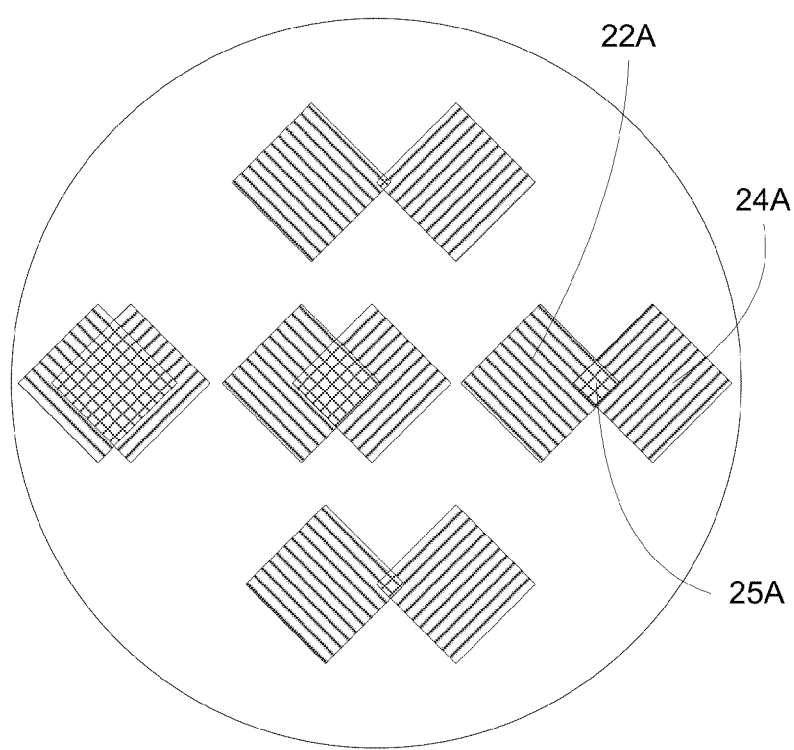

FIGS. 2A-2C illustrate exemplary dual shadow mask structures according to some embodiments of the present invention. In FIG. 2A, a dual shadow mask substrate 20 comprises dual shadow mask structures 29A and 29B fabricated on substrate 21, through bottom shadow mask electrode layer 22, dielectric layer 23, and top shadow mask electrode layer 24. The dual shadow mask structures 29A and 29B comprise dielectric layer 23 sandwiched between bottom electrodes 22A and 22B, and top electrodes 24A and 24B, respectively. The effective capacitor areas for the dual shadow mask structures 29A and 29B are the overlapping areas 25A and 25B between the top and bottom electrodes, regardless of the sizes of the electrodes.

FIG. 2A shows a schematic representation of the layers 22, 23, and 24 on substrate 21 for illustrative purposes, and may be somewhat different from actual device cross section. For example, the layers shown are not drawn to scales, with the lateral dimensions of the electrodes much larger than the thicknesses of the layers. The dimension of the electrodes can be about 50 µm to a few thousand microns, while the thickness of the electrodes is typically less than 1 micron, and the thickness of the dielectric layer 23 is less than 5-10 nm.

FIG. 2B shows a more realistic schematic representation of a portion of the structure 29A, still not drawn to scales. The dielectric layer 23 bends over the edge of the bottom electrode 22A, resting on the substrate surface. Similarly, the top electrode 24A follows the contour of the dielectric layer 23, adhering to the surface of the dielectric layer.

FIG. 2C shows a top view of the shadow mask substrate 20 showing different overlapping areas with top and bottom electrodes having similar sizes. With the dielectric layer 23 very thin, order of tens of Angstroms, the bottom electrode layer 22 having electrode areas 22A might be visible together with the top electrode layer 24 having electrode areas 24A. Overlapping areas 25A show the effective areas of the shadow mask structure formed by top and bottom electrodes 24A and 22A, respectively.

In some embodiments, a fabrication process comprising two shadow mask deposition steps is used to form the capacitor structures with small effective areas on a substrate. FIGS. 3A-3D illustrate an exemplary method for forming capacitor structures on a substrate according to some embodiments of the present invention. The method comprises first forming a bottom patterned electrode layer on the substrate by depositing a first conductive material through one or more apertures of a first shadow mask, wherein the bottom patterned electrode layer comprises one or more bottom electrodes (FIG. 3B). A dielectric layer is formed next on the bottom patterned electrode layer (FIG. 3C), followed by a top patterned electrode layer, formed on the dielectric layer by depositing a second conductive material through one or more apertures of a second shadow mask, wherein the top patterned electrode layer comprises one or more top electrodes (FIG. 3D). In some embodiments, at least a top electrode of the one or more top electrodes and a bottom electrode of the one or more bottom electrodes overlap to form a capacitor structure comprising an overlapped dielectric area.

In some embodiments, the overlapped dielectric area is smaller than the top electrode area or the bottom electrode area, preferably is smaller than 10 microns. The top electrodes and the bottom electrodes can overlap to form capacitor structures having overlapped dielectric areas of different sizes. In some embodiments, the first and second shadow masks are a same shadow mask, and the second shadow mask is positioned before forming the top patterned electrode layer to achieve a shift between the patterns of the top and bottom patterned electrode layers.

Figure 3A:
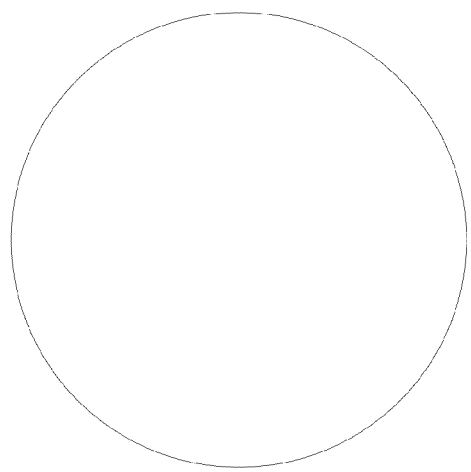
FIGS. 3A-3D illustrate an exemplary process flow for forming capacitor structures using dual shadow masks according to some embodiments of the present invention.
Figure 3B:
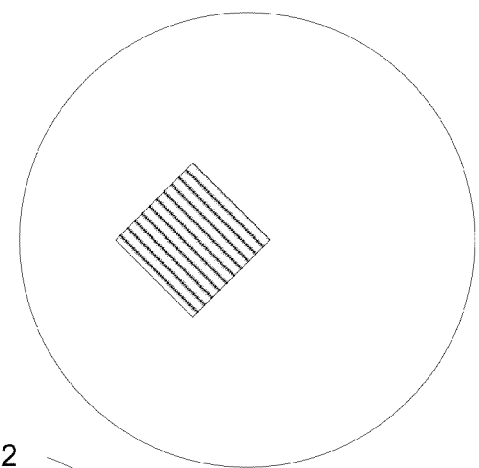
Figure 3C:
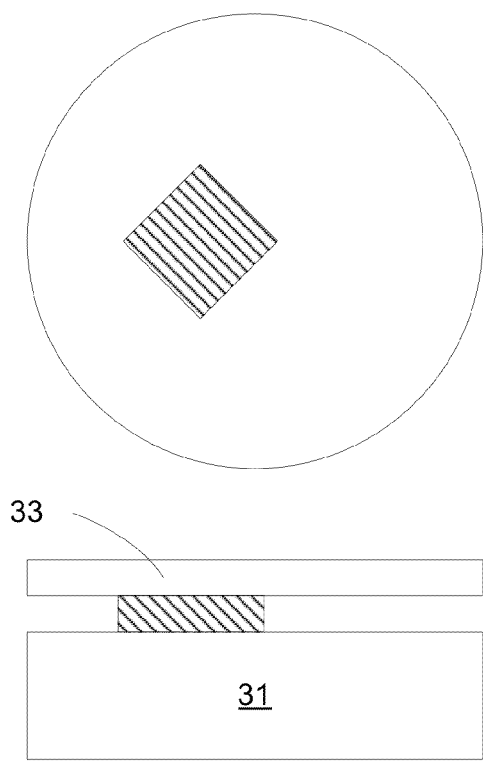
Figure 3D:
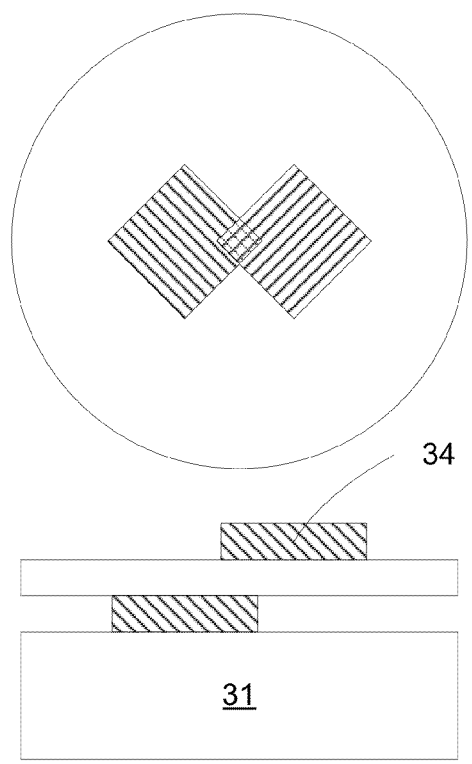

FIGS. 3A-3D illustrate an exemplary process flow for forming capacitor structures using dual shadow masks according to some embodiments of the present invention. In FIG. 3A, a substrate 31 is provided. The substrate 31 is shown to be round, but any dimension can be used. For example, the substrate 31 can be a semiconductor wafer, or can be portions of a semiconductor wafer. In FIG. 3B, a bottom patterned electrode layer is formed on the substrate 31 through a first shadow mask. The bottom pattern electrode layer comprises a bottom electrode pattern, having a plurality of bottom electrodes 32 disposed on the substrate 31. The bottom electrodes 32 can have similar sizes and shapes, or can have different sizes and shapes from each other.

In FIG. 3C, a dielectric layer 33 is formed on the bottom patterned electrode layer. The dielectric layer 33 is thin, such as less than 5 nm thick, and in some cases, can be visible from the top view. In FIG. 3D, a top patterned electrode layer is formed on the dielectric layer 33 through a second shadow mask. The top pattern electrode layer comprises a top electrode pattern, having a plurality of top electrodes 34 disposed on the dielectric layer 33. The overlapping area of the top and bottom electrodes forms the effective area for the capacitor structure.

In some embodiments, the present dual shadow mask concept allows capacitor structure formation with effective capacitance areas independent of the sizes and shapes of the top or bottom electrodes. The present dual shadow mask can allow additional designs or patterns for the top or bottom electrodes to improve or facilitate testing procedures.

Figure 4:
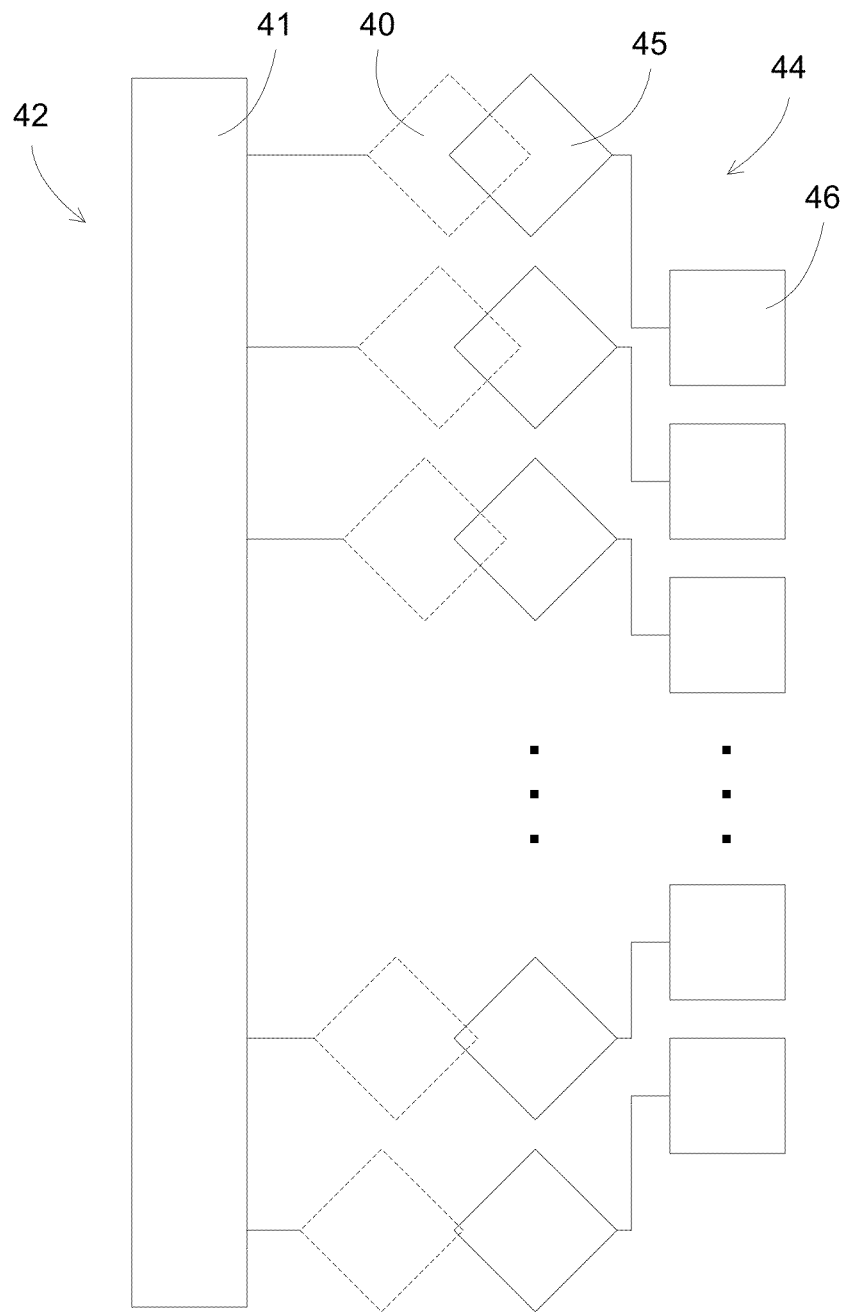
FIG. 4 illustrates an exemplary design for the top and bottom shadow masks according to some embodiments of the present invention.

FIG. 4 illustrates an exemplary design for the top and bottom shadow masks according to some embodiments of the present invention. The top electrode pattern 44 can include automatic probing pattern 46, comprising top electrode areas 45 connected to probe pads arranged in regular and repeated patterns to enable automatic probing of multiple devices, for example, through a probe card. A single column probe pad pattern is shown, but other automatic probing patterns are also within the scope of the present invention, for example, two-column probe pad pattern.

A bottom electrode pattern 42 is also shown, comprising a common probing area 41 connected to all the bottom electrode areas 40. The common probe area 41 can be disposed at the edge of the substrate, or at some locations that have the bottom electrode layer exposed to be probe tested. Alternatively, the bottom electrode pattern can comprise an automatic probe pad pattern similar to the top electrode pattern.

In some embodiments, the overlap area of the capacitors can be varied across the shadow mask to understand device properties as a function of area. Also, openings of different shape can be combined together to form common regions with the same perimeter but with different areas to understand whether leakage is perimeter or area dominated.

In some embodiments, the two shadow masks can have different patterns, designed to achieve different sizes of effective capacitor areas through the overlap of the electrode patterns on the two shadow masks. Alignment mechanisms, such as an alignment pin, can be included to align the top shadow mask to the bottom shadow mask.

In some embodiments, the top and bottom electrode layers can be formed using a same shadow mask, or by using different shadow masks having a same pattern. The overlapped areas can be achieved by shifting the top shadow mask used in the top electrode deposition with respect to the bottom shadow mask pattern shown by the bottom electrode layer. The shifting can be accomplished by a rotational or a translational movement. Different amounts of shifting can also be performed to achieve different overlapping patterns, allowing the use of one shadow mask for multiple different size capacitor structures. Additional alignment mechanisms can be included to align the two shadow masks to achieve predetermined amounts of shifting.

Figure 5A:
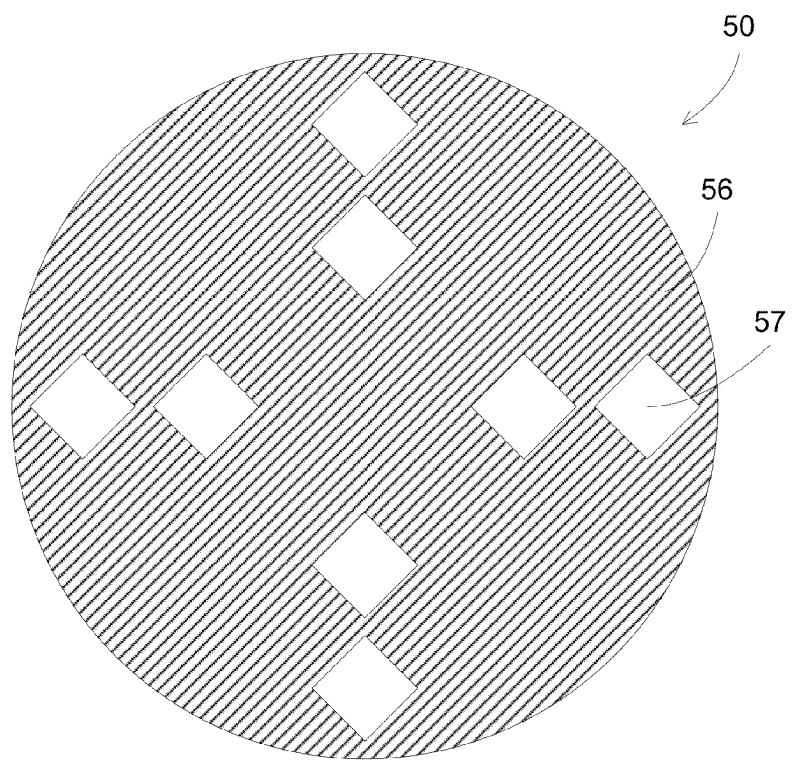
FIGS. 5A-5B illustrate exemplary dual shadow mask structures achieved by rotating a same shadow mask according to some embodiments of the present invention.
Figure 5B:
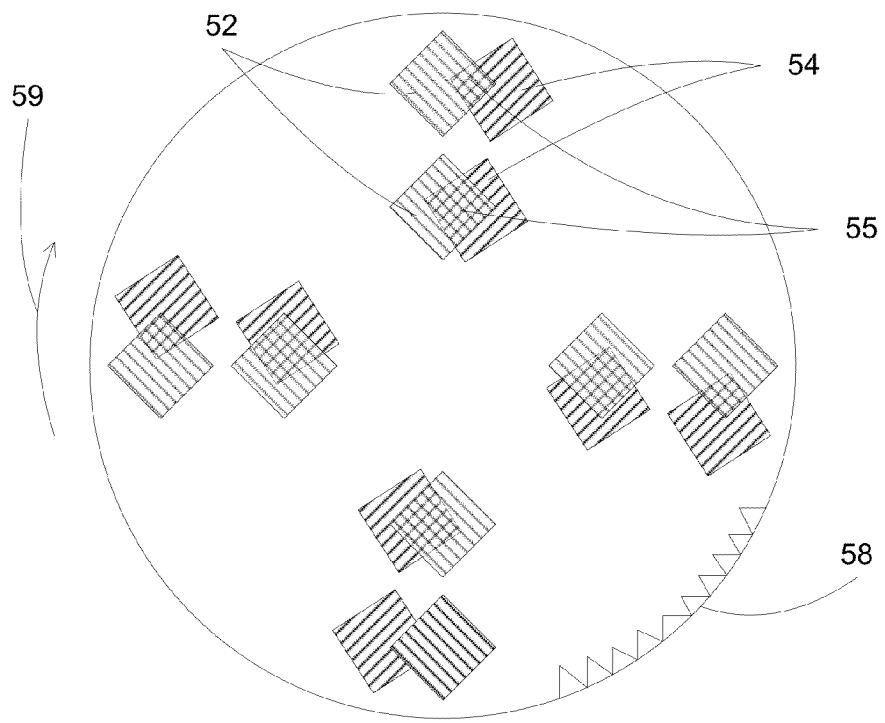

FIGS. 5A-5B illustrate exemplary dual shadow mask structures achieved by rotating a same shadow mask according to some embodiments of the present invention. In FIG. 5A, shadow mask 50 is shown, comprising a pattern of apertures 57 on a thin sheet of material 56. The apertures 57 are arranged in circular patterns, having a same size electrode area. Other designs can be used, such as different size electrodes or linear patterns.

In FIG. 5B, the shadow mask is used in the deposition of the top and bottom electrode, with an amount of rotation 59. A teeth pattern 58 can be included in the shadow mask design to assist in determining the degree of rotation. In the first deposition, a bottom electrode pattern can form, generating bottom electrodes 52. In the second deposition, a top electrode pattern can form, generating top electrodes 54. Different overlapping areas 55 can be formed through the rotation of the shadow mask in the second electrode deposition.

Figure 6A:
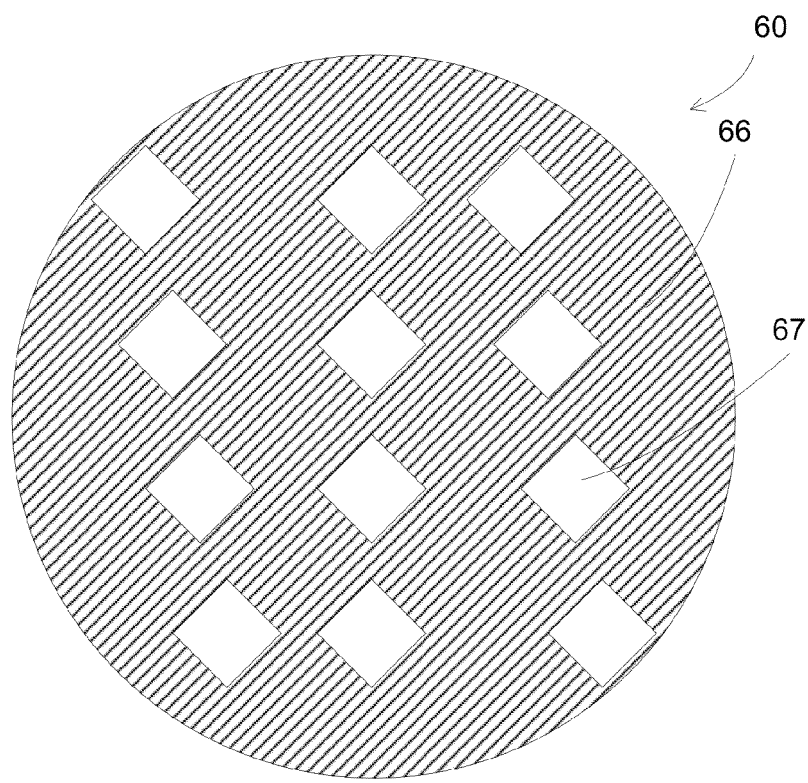
FIGS. 6A-6B illustrate exemplary dual shadow mask structures achieved by translating a same shadow mask according to some embodiments of the present invention.
Figure 6B:
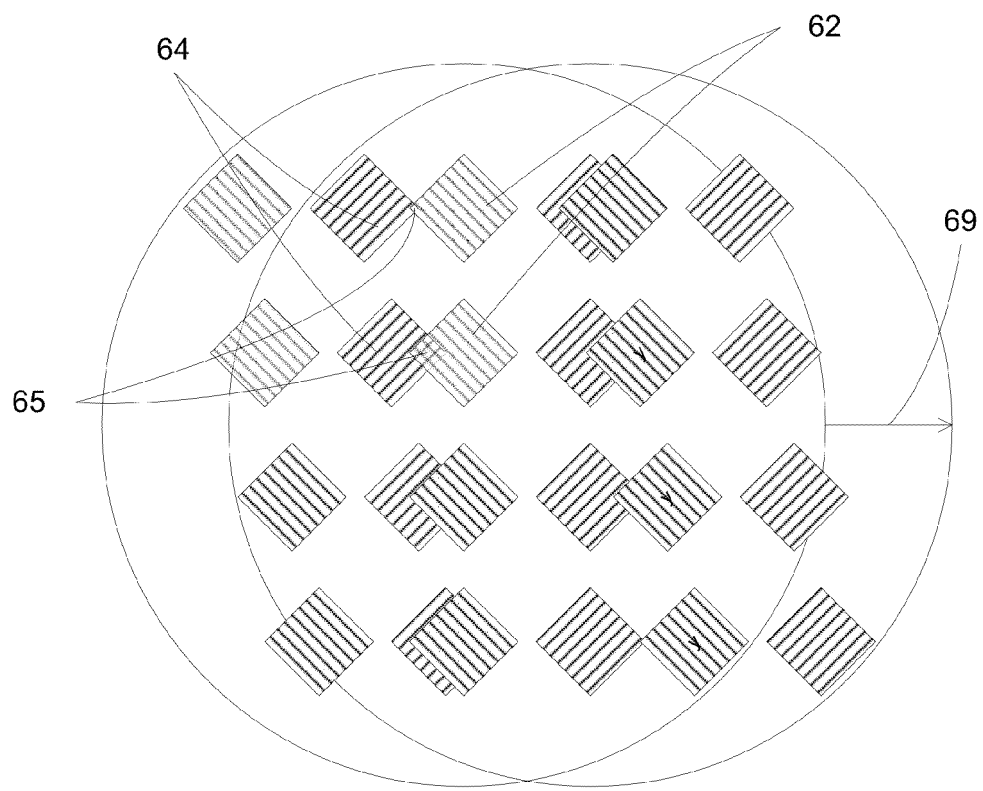

FIGS. 6A-6B illustrate exemplary dual shadow mask structures achieved by translating a same shadow mask according to some embodiments of the present invention. In FIG. 6A, shadow mask 60 is shown, comprising a pattern of apertures 67 on a thin sheet of material 66. The apertures 67 are arranged in linear patterns, having a same size electrode area. Other designs can be used, such as different size electrodes or circular patterns.

In FIG. 6B, the shadow mask is used in the deposition of the top and bottom electrode, with an amount of translation 69. In the first deposition, a bottom electrode pattern can form, generating bottom electrodes 62. In the second deposition, a top electrode pattern can form, generating top electrodes 64. Different overlapping areas 65 can be formed through the translation of the shadow mask in the second electrode deposition.

In some embodiments, the present dual shadow mask design can be used in one or more implementations of various technologies and techniques directed at processing a substrate using a shadow mask to perform patterned depositions. In one implementation, the shadow mask may be part of a combinatorial processing tool. In this implementation, the shadow mask may be similar, slightly larger or slightly smaller than the size of the substrate in order to facilitate the processing of a whole substrate. The shadow mask may be formed from one layer of material, or can be formed by sandwiching two layers: a thick mask, or stiffener plate, and a thin membrane. The stiffener plate may contain cutout holes that may be shaped like individual dies or fields that may exist on a substrate. One of the two sides of the stiffener plate may be manufactured to an exceptionally flat finish in order to keep the second layer of the shadow mask highly coplanar with the first layer.

Another advantage may include the ability of the shadow mask to be extremely flat and highly coplanar when coupled across the substrate. The flatness of the shadow mask may facilitate for features to be deposited on the substrate with sharp and well defined boundaries. The shadow mask may be aligned to one or multiple pre-existing features of each substrate portion. The shadow mask may be rotated or translated appropriately to the substrate at each site to achieve a desired overlapping pattern.

Various implementations described herein may have many advantages including maximizing the shadow mask such that it may be used for whole substrates (e.g. 200-300 mm wafers). The shadow mask may facilitate the processing of a whole substrate, or for multiple dies on the substrate, such that simultaneous High-Productivity Combinatorial (HPC) depositions may be done at multiple sites on the substrate.

In another implementation, the shadow mask may be used to process a portion of the substrate as opposed to a whole substrate, corresponding to a single processing condition of the HPC matrix on the substrate. Different shadow masks may be secured to different portions of the substrate, to be used in different electrode deposition processes. Alternatively, the shadow mask may be attached to an aperture piece of a Physical Vapor Deposition (PVD) tool, wherein the PVD tool is brought down so that the shadow mask in contact with the substrate portion before deposition occurs.

The manufacture of microelectronic devices entails the integration and sequencing of many unit processing steps, with potential new process developments. For example, high-k gate dielectrics have higher leakage current than silicon oxide at a same physical thickness, thus capacitor structures with different, and smaller, electrode sizes are needed to effectively evaluating the different high-k materials, accounting for the high leakage currents. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). In this invention, HPC processing techniques is disclosed to the development of MOS capacitor structures to evaluate high-k dielectric and device performance.

"Combinatorial Processing" generally refers to techniques of differentially processing multiple regions of one or more substrates. Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.).

Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Combinatorial processing may include any processing, including semiconductor processing, which varies the processing conditions across one or more substrates. As used herein, a substrate may be, for example, a semiconductor wafer, a portion of a semiconductor wafer, solar photovoltaic circuitry, or other semiconductor substrate. The term "substrate" may include a coupon, which is a diced portion of a wafer, or any other device on which semiconductor processes are performed. The coupon or substrate may optionally contain one die, multiple dies (connected or not through the scribe), or portion of die with useable test structures. In some implementations, multiple coupons or die can be diced from a single wafer and processed combinatorially.

Combinatorial processing is performed by varying processing conditions across multiple substrates, multiple regions of a single substrate, or a combination of the two. Processing conditions may include, for example, temperatures, reaction times, concentrations and the like. For example, a first region of a substrate may be processed using a first process condition (e.g., depositing a chemical at a first temperature) and a second region of the substrate may be processed using a second process condition (e.g., depositing the chemical at a second temperature). The results (e.g., the measured characteristics of the processed regions) are evaluated, and none, one, or both of the process conditions may be selected as suitable candidates for larger scale processing (e.g., further combinatorial processing or deposition on a full wafer).

Several combinatorial processing tools can be used. One type of tool may include a reactor block that has several openings (e.g., cylindrical openings) that define individual reactors on one or more substrates. For example, a reactor block may include 28 openings that define 28 regions on a substrate. Each of the 28 regions can be processed using varying process conditions, or multiple regions can have the same processing conditions. For example, seven sets of processing conditions can be performed across four regions each. Each region can then be characterized using various techniques and useful or beneficial techniques and/or conditions can be selected.

Other combinatorial processing may be performed in a manner that is not site isolated. For example, a wafer can be divided into many small coupons, each of which can be processed using different conditions. Using another example, a wafer can be processed using a gradient approach, where the processing varies over the substrate. These techniques may also be used in combination with site-isolated combinatorial techniques.

Figure 7:
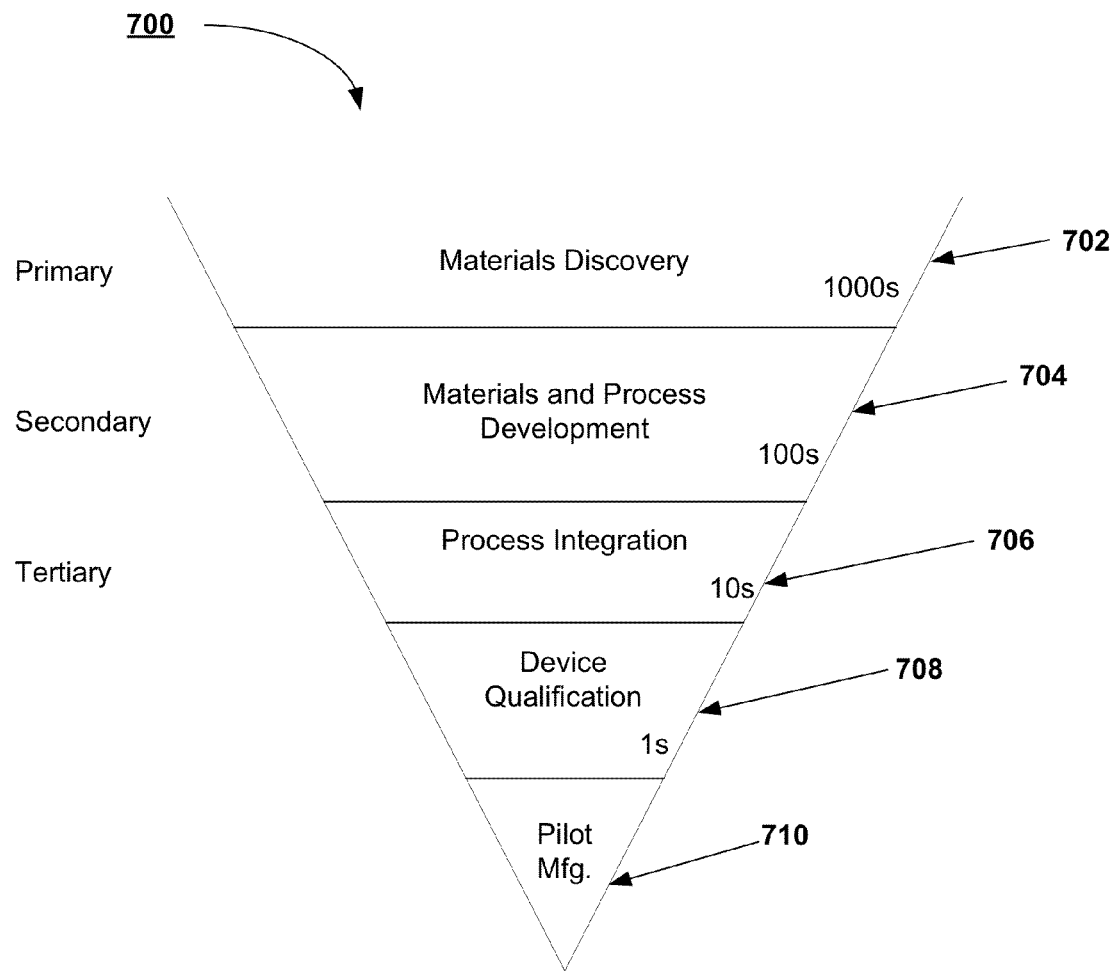
FIG. 7 illustrates a schematic diagram for implementing combinatorial processing according to some embodiments of the present invention.

FIG. 7 illustrates a schematic diagram 700 for implementing combinatorial processing according to some embodiments of the present invention. The schematic diagram 700 illustrates that the relative number of combinatorial processes that run with a group of substrates decreases as certain materials and/or processes are selected. Generally, combinatorial processing includes performing a large number of processes during a first screen, selecting promising candidates from those processes, performing the selected processing during a second screen, selecting promising candidates from the second screen, and so on. In addition, feedback from later stages to earlier stages can be used to refine the success criteria and provide better screening results.

For example, thousands of materials are evaluated during a materials discovery stage 702. Materials discovery stage 702 is also known as a primary screening stage performed using primary screening techniques. Primary screening techniques may include dividing wafers into coupons and depositing materials using varied processes. The materials are then evaluated, and promising candidates are advanced to the secondary screen, i.e., materials and process development stage 704. Evaluation of the materials may be performed using metrology tools such as electronic testers and imaging tools, e.g., microscopes.

The materials and process development stage 704 may evaluate hundreds of materials (i.e., a magnitude smaller than the primary stage) and may focus on the processes used to deposit or develop those materials. Promising materials and processes are again selected, and advanced to the tertiary screen or process integration stage 706, where tens of materials and/or processes and combinations are evaluated. The tertiary screen or process integration stage 706 may focus on integrating the selected processes and materials with other processes and materials.

The most promising materials and processes from the tertiary screen are advanced to device qualification stage 708. In device qualification, the materials and processes selected are evaluated for high volume manufacturing, which normally is conducted on full wafers within production tools, but need not be conducted in such a manner. The results are evaluated to determine the efficacy of the selected materials and processes. If successful, the use of the screened materials and processes can proceed to the manufacturing stage 710.

The schematic diagram 700 is an example of various techniques that may be used to evaluate and select materials and processes for the development of semiconductor devices. The descriptions of primary, secondary and subsequent screening and the various stages 702-710 are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of high-k device fabrication process with metal gate by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a high-k device. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the high-k device. For example, such structures may include, but would not be limited to, high-k dielectric layers, metal gate layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 8:
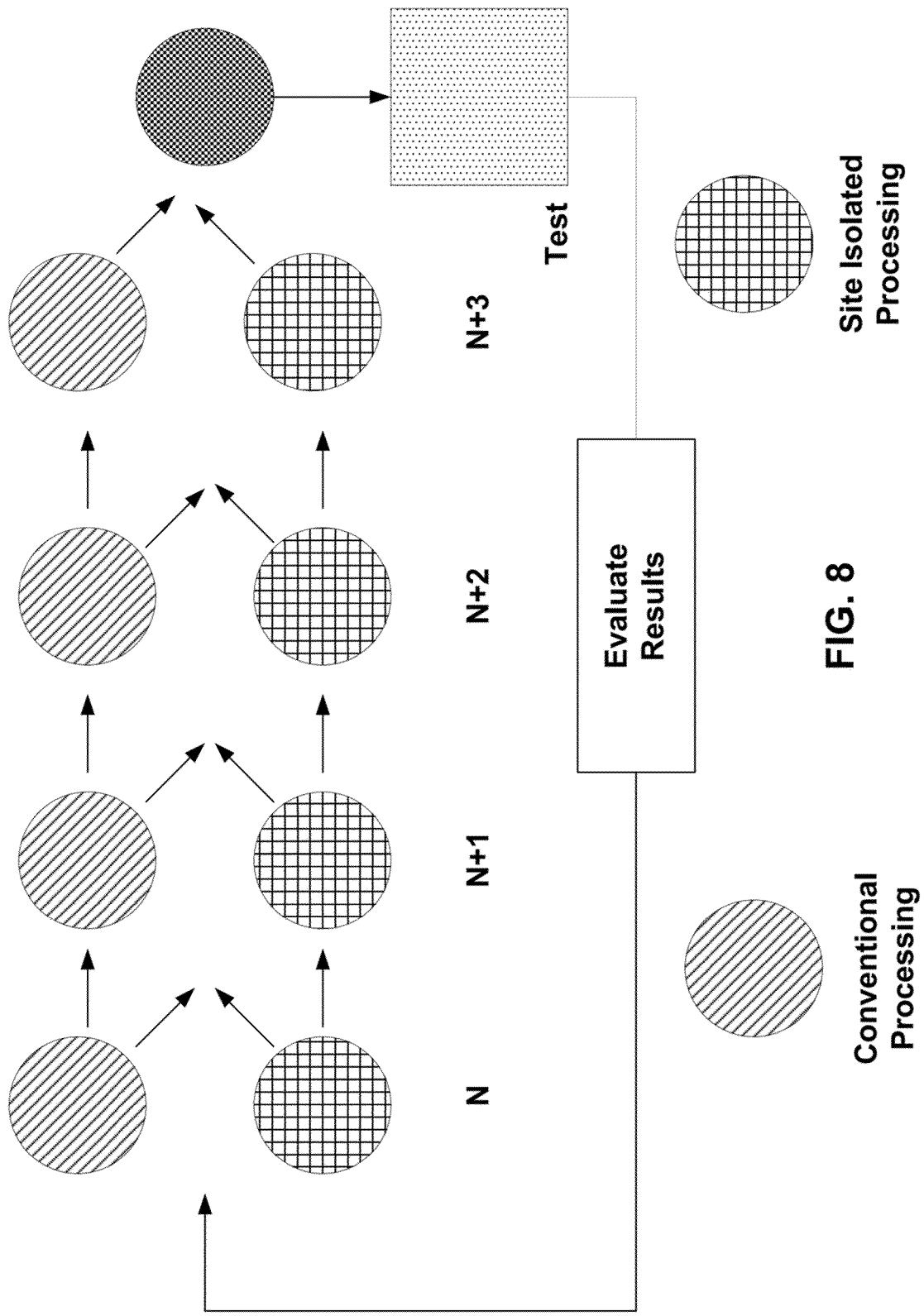
FIG. 8 illustrates a simplified schematic diagram illustrating a general methodology for combinatorial process sequence integration that includes site isolated processing and/or conventional processing according to some embodiments of the present invention.

FIG. 8 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 8. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

In some embodiments, the present invention discloses capacitor testing structures to evaluate dielectric materials, for example, to identify their dielectric constant values, or their leakage current characteristics. Advanced semiconductor devices can employ novel materials such as metal gate electrodes and high-k dielectrics, which comprise dielectric materials having a dielectric constant greater than that of silicon dioxide. Typically high-k dielectric materials include aluminum oxide, hafnium oxide, zirconium oxide, tantalum oxide, titanium oxide, or their alloys such as hafnium silicon oxide or zirconium silicon oxide. Metal gate materials typically comprise a refractive metal or a nitride of a refractive metal, such as titanium nitride, titanium aluminum nitride, or titanium lanthanum nitride. Different high-k dielectric materials exhibit different dielectric constants and different leakage currents, together with different integration behavior with metal gate materials, leading to the need to screen the various high-k dielectric and metal gate materials to meet device performance levels.

In some embodiments, the present invention discloses methods to form capacitor structures on a substrate using shadow mask process with high-k dielectric and metal gate materials. In some embodiments, the present capacitance areas are not limited by the shadow mask design. By forming two metal gate electrodes patterned layers sandwiching a high-k dielectric layer, small area capacitor structures can be fabricated to evaluate the performance of high-k dielectric and metal gate materials.

In some embodiments, the present invention discloses combinatorial workflow for evaluating high-k dielectric and metal gate materials using dual shadow mask designs. High productivity combinatorial processing can be a fast and economical technique for electrically screening high-k dielectric and metal gate materials to determine their proper process integration to advanced semiconductor devices, achieving improved transistor performance through the incorporation of novel high-k dielectric and metal gate materials.

In some embodiments, the dielectric layer is formed through a deposition process, such as chemical vapor deposition (CVD), atomic layer deposition (ALD), or physical vapor deposition (PVD). The electrode layer can be formed by PVD through a shadow mask.

Figure 9:
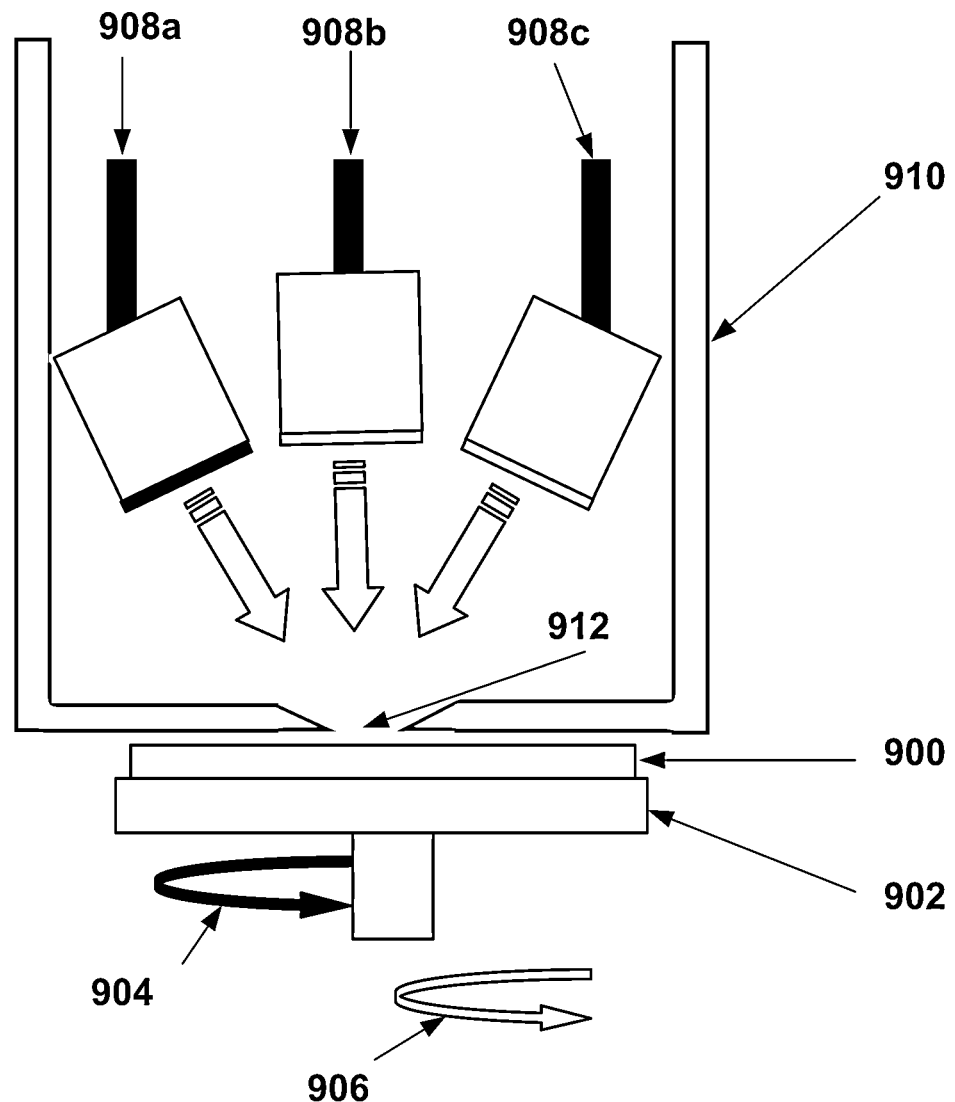
FIG. 9 illustrates a schematic diagram of a combinatorial PVD system according to an embodiment described herein.

FIG. 9 illustrates a schematic diagram of a combinatorial PVD system according to an embodiment described herein. Details of the combinatorial PVD system are described in U.S. patent application Ser. No. 12/027,980 filed on Feb. 7, 2008 and claiming priority to Sep. 5, 2007 and U.S. patent application Ser. No. 12/028,643 filed on Feb. 8, 2008 and claiming priority to Sep. 5, 2007. Substrate, 900, is held on substrate support, 902. Substrate support, 902, has two axes of rotation, 904 and 906. The two axes of rotation are not aligned. This feature allows different regions of the substrate to be accessed for processing. The substrate support may be moved in a vertical direction to alter the spacing between the PVD targets and the substrate. The combinatorial PVD system comprises multiple PVD assemblies configured within a PVD chamber (not shown). In FIG. 9, three PVD assemblies are shown, 908a-908c. Those skilled in the art will appreciate that any number of PVD assemblies may be used, limited only by the size of the chamber and the size of the PVD assemblies. Typically, four PVD assemblies are contained within the chamber. Advantageously, the multiple PVD assemblies contain different target materials to allow a wide range of material and alloys compositions to be investigated. Additionally, the combinatorial PVD system will typically include the capability for reactive sputtering in reactive gases such as $O_2$, $NH_3$, $N_2$, etc. The PVD assemblies may be moved in a vertical direction to alter the spacing between the PVD targets and the substrate and may be tilted to alter the angle of incidence of the sputtered material arriving at the substrate surface. The combinatorial PVD system further comprises a process kit shield assembly, 910. The process kit shield assembly includes an aperture, 912, used to define isolated regions on the surface. The portion of the process kit shield assembly that includes the aperture may have both rotational and translational capabilities. The combination of the substrate support movement, PVD assembly movement, and process kit shield assembly aperture movement allows multiple regions of the substrate to be processed in a site isolated manner wherein each site can be processed without interference from adjacent regions. Advantageously, the process parameters among the multiple site isolated regions can be varied in a combinatorial manner.

Figure 10:
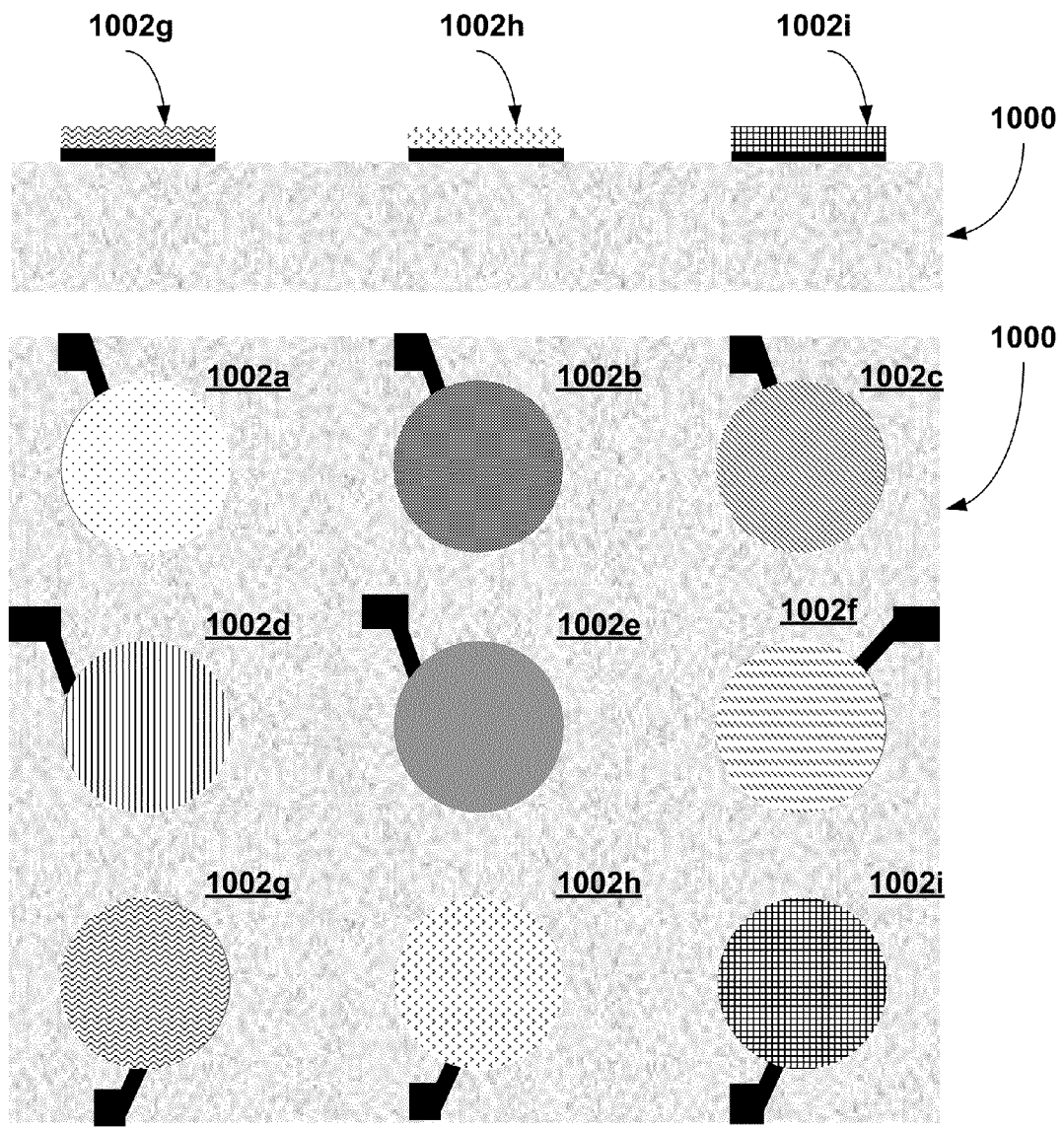
FIG. 10 illustrates a schematic diagram of a substrate that has been processed in a combinatorial manner.

FIG. 10 illustrates a schematic diagram of a substrate that has been processed in a combinatorial manner. A substrate, 1000, is shown with nine site isolated regions, 1002a-1002i, illustrated thereon. Although the substrate 1000 is illustrated as being a generally square shape, those skilled in the art will understand that the substrate may be any useful shape such as round, rectangular, etc. The lower portion of FIG. 10 illustrates a top down view while the upper portion of FIG. 10 illustrates a cross-sectional view taken through the three site isolated regions, 1002g-1002i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 8.

In some embodiments, the electrical testing comprises at least one of an I-V measurement, a C-V measurement, a flatband voltage shift measurement, or an effective work function measurement.

Figure 11:
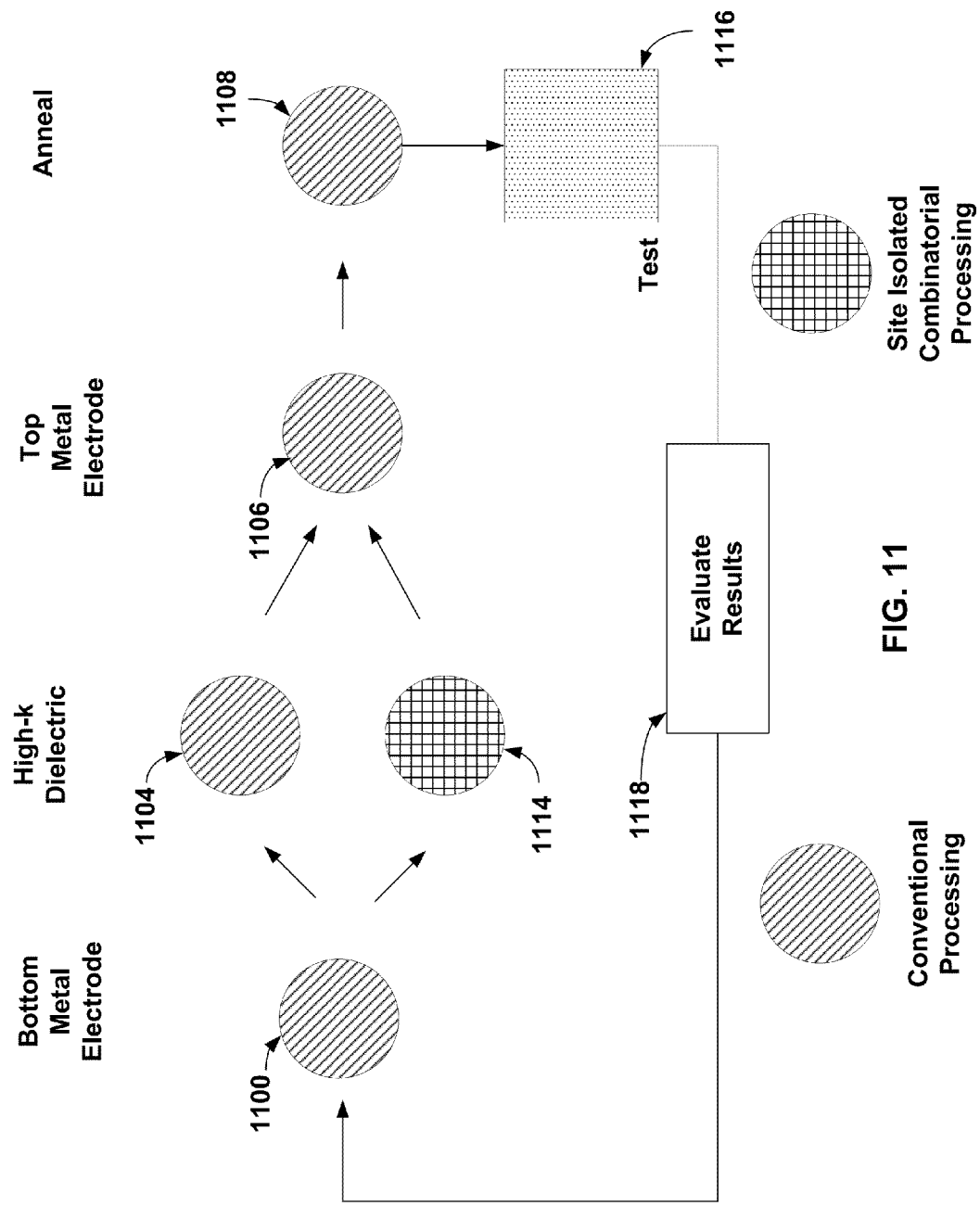
FIG. 11 illustrates a flow diagram for forming simple test structures according to an embodiment described herein.

FIG. 11 illustrates a flow diagram for forming simple test structures according to an embodiment described herein. Several of the layers or process steps provide opportunities to apply combinatorial techniques to the development and investigation of the materials and treatments for the layers. For evaluating metal gate electrodes, parameter candidates include the high-k dielectric layer, and the metal electrode layer. As mentioned previously, examples of suitable high-k dielectric layers comprise hafnium oxide, zirconium oxide, aluminum oxide, or any mixture combination, etc. hafnium oxide and hafnium silicon oxide are the material most often used currently as the high-k dielectric layer for metal gate stack devices. The high-k dielectric layer may be deposited using chemical vapor deposition (CVD), atomic layer deposition (ALD), or plasma enhanced CVD or ALD. The characteristics of the high-k layer and the high-k/metal gate interface may be investigated using HPC techniques by varying process parameters such as high-k material, deposition process condition, surface preparation process, interface layer (such as a silicon oxide layer), etc. These are meant to be illustrative parameters and those skilled in the art will be able to apply HPC techniques to any of the commonly used process parameters.

Another layer that may be investigated using HPC techniques includes the metal gate electrode layer. Examples of suitable metal gate electrode materials comprise titanium, tantalum, aluminum, lanthanum, their alloys, nitrides and nitride alloys, etc. Typically, PVD is the preferred method of deposition for the metal gate electrode layer. The deposition of the metal electrode layer by PVD may be investigated using HPC techniques by varying process parameters such as material, power, pressure, target to substrate distance, atomic ratio, etc. These are meant to be illustrative parameters and those skilled in the art will be able to apply HPC techniques to any of the commonly used process parameters.

Returning to FIG. 11, through the use of a combination of conventional and combinatorial processing systems (i.e. systems capable of processing multiple isolated regions on a single substrate) a number of trajectories through the various systems illustrated in the flow diagram of FIG. 11 can be envisioned. In FIG. 11, the bottom metal electrode layer may be deposited in a conventional processing manner, 1100, in some embodiments where the bottom metal electrode is not a variable. As discussed previously, the high-k dielectric layer may be processed in a conventional processing manner, 1104, or in a site isolated combinatorial processing manner, 1114. The top metal electrode layer may be deposited in a conventional processing manner, 1106, in some embodiments where the top metal electrode is not a variable. The anneal process, such as a post metallization anneal in forming gas, may be processed in a conventional processing manner, 1108. After the deposition of the various layers and subsequent processing, the various MOS capacitor devices represented by each of the site isolated regions may be testing in step 1116, and the results evaluated in step, 1118. As discussed previously, the results will form the basis for additional cycles of investigation through HPC techniques to identify materials and process conditions that evaluate the suitability of photoresist strip exposure in devices having the given high-k dielectric and metal gate electrode.

Using the simple diagram in FIG. 11, there are two possible trajectories through the process sequence, which encompass all of the possible combinations of conventional and combinatorial processing illustrated. Those skilled in the art will understand that HPC techniques may be applied to other processes not illustrated such as anneal treatments, cleaning, etching, rinsing, surface treatments, surface functionalization, etc. As more variable process steps are included, the total number of required experiments increases dramatically. This illustrates the benefits of using HPC techniques to limit the number of substrates to a manageable number and minimize the cost of the development program.

The illustrated simple diagram represents a possible evaluation process for the side effects of various photoresist strip chemicals on a specific high-k gate dielectric and metal gate electrode. The variables further include other process windows, such as the exposure temperature, time, and concentration.

Figure 12:
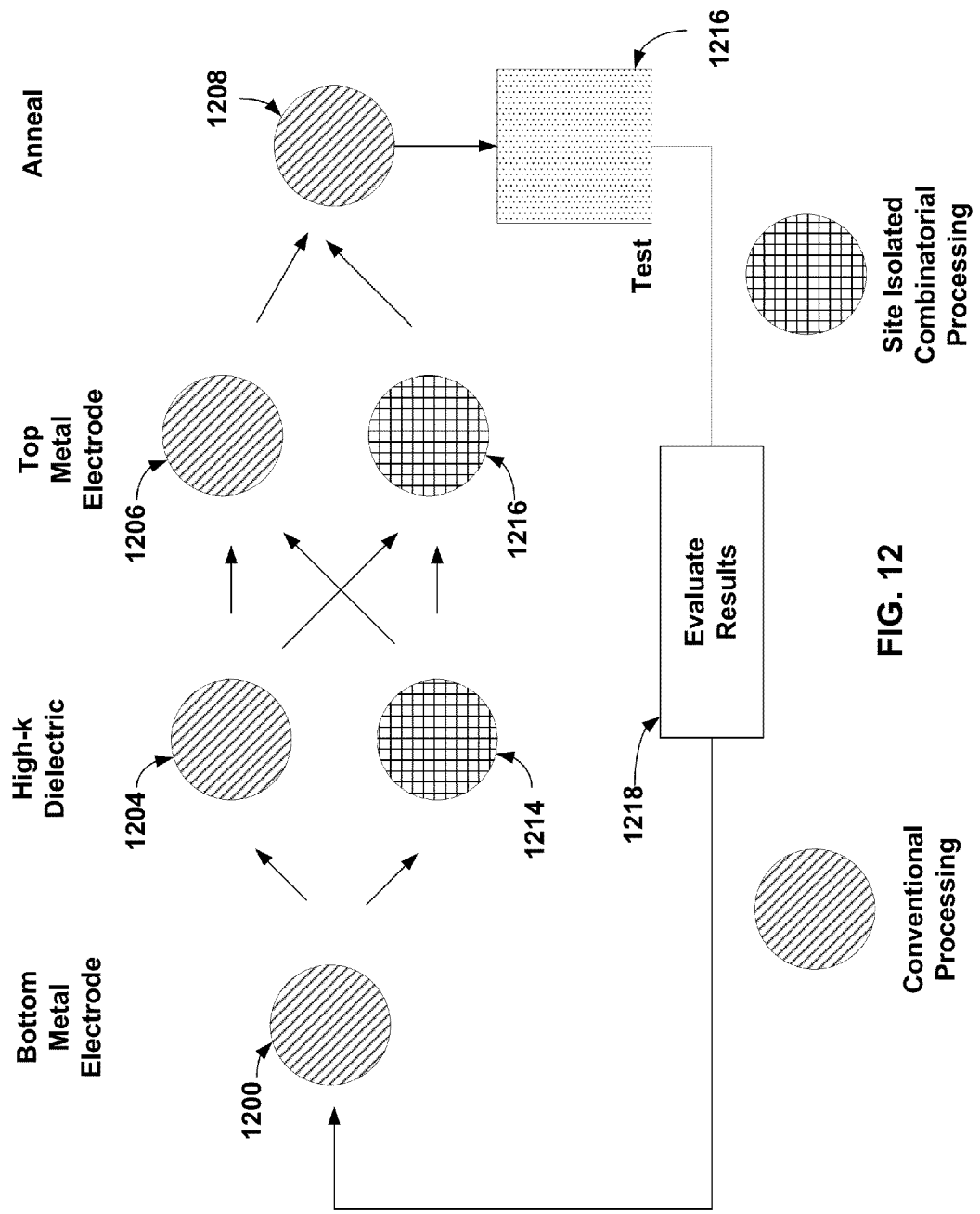
FIG. 12 illustrates a flow diagram for forming another exemplary test structure evaluation according to an embodiment described herein.

FIG. 12 illustrates a flow diagram for forming another exemplary test structure evaluation according to an embodiment described herein. Additional layers can be included in the test methodology, including the metal gate electrode layer. Through the use of a combination of conventional and combinatorial processing systems (i.e. systems capable of processing multiple isolated regions on a single substrate) a number of trajectories through the various systems illustrated in the flow diagram of FIG. 12 can be envisioned. In FIG. 12, the bottom electrode layer may be deposited in a conventional processing manner, 1200, in some embodiments where the bottom electrode layer is not a variable. As discussed previously, the high-k dielectric layer may be processed in a conventional processing manner, 1204, or in a site isolated combinatorial processing manner, 1214. The top metal electrode layer may be deposited in a conventional processing manner, 1206, or in a site isolated combinatorial processing manner, 1216. The anneal process, such as a post metallization anneal in forming gas, may be processed in a conventional processing manner, 1208. After the deposition of the various layers and subsequent processing, the various MOS capacitor devices represented by each of the site isolated regions may be testing in step 1216, and the results evaluated in step, 1218. As discussed previously, the results will form the basis for additional cycles of investigation through HPC techniques to identify materials and process conditions that evaluate the suitability of photoresist strip exposure with respect to different metal gate electrode in devices having the given high-k dielectric.

Using the simple diagram in FIG. 12, there are four possible trajectories through the process sequence. These four trajectories encompass all of the possible combinations of conventional and combinatorial processing illustrated. Those skilled in the art will understand that HPC techniques may be applied to other processes not illustrated such as anneal treatments, cleaning, rinsing, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

In some embodiments, the present invention discloses an exemplary method for forming capacitor structures on a substrate in a combinatorial manner, comprising first depositing a bottom patterned electrode layer on the substrate by depositing a bottom conductive material through one or more apertures in a first shadow mask, wherein the bottom patterned electrode layer comprises one or more bottom electrodes. A dielectric layer is next deposited on the bottom electrode pattern layer in multiple site isolated regions, wherein the dielectric layer is varied in a combinatorial manner. Then a top patterned electrode layer is deposited on the dielectric layer by depositing a top conductive material through one or more apertures in a second shadow mask, wherein the top patterned electrode layer comprising one or more top electrodes. In some embodiments, at least a top electrode of the one or more top electrodes and a bottom electrode of the one or more bottom electrodes overlap to form a capacitor structure comprising an overlapped dielectric area. The overlapped area is preferably smaller than the top electrode area or the bottom electrode area. In other embodiments, multiple top and bottom electrodes overlap to form capacitor structures having different overlapped areas.

The first and second shadow mask can be secured on the substrate before depositing the bottom and bottom conductive material, respectively. The first and second shadow masks can be the same shadow mask, with the second shadow mask positioned on the dielectric layer to achieve a shift between the patterns of the top and bottom patterned electrode layers.

The dielectric layer can be varied in a combinatorial manner, for example, by varying a dielectric layer thickness or a dielectric layer material in multiple site isolated regions. The top patterned electrode layer can be deposited in multiple site isolated regions, wherein the top patterned electrode layer is varied in a combinatorial manner, which can comprise singulating the substrate according to the multiple isolated regions, positioning multiple second shadow masks on the multiple isolated regions, and depositing a top conductive material on the multiple isolated regions through one or more apertures in the multiple second shadow masks. Alternatively, the top patterned electrode layer can be varied in a combinatorial manner by varying a shift of the multiple second shadow masks.

Figure 13A:
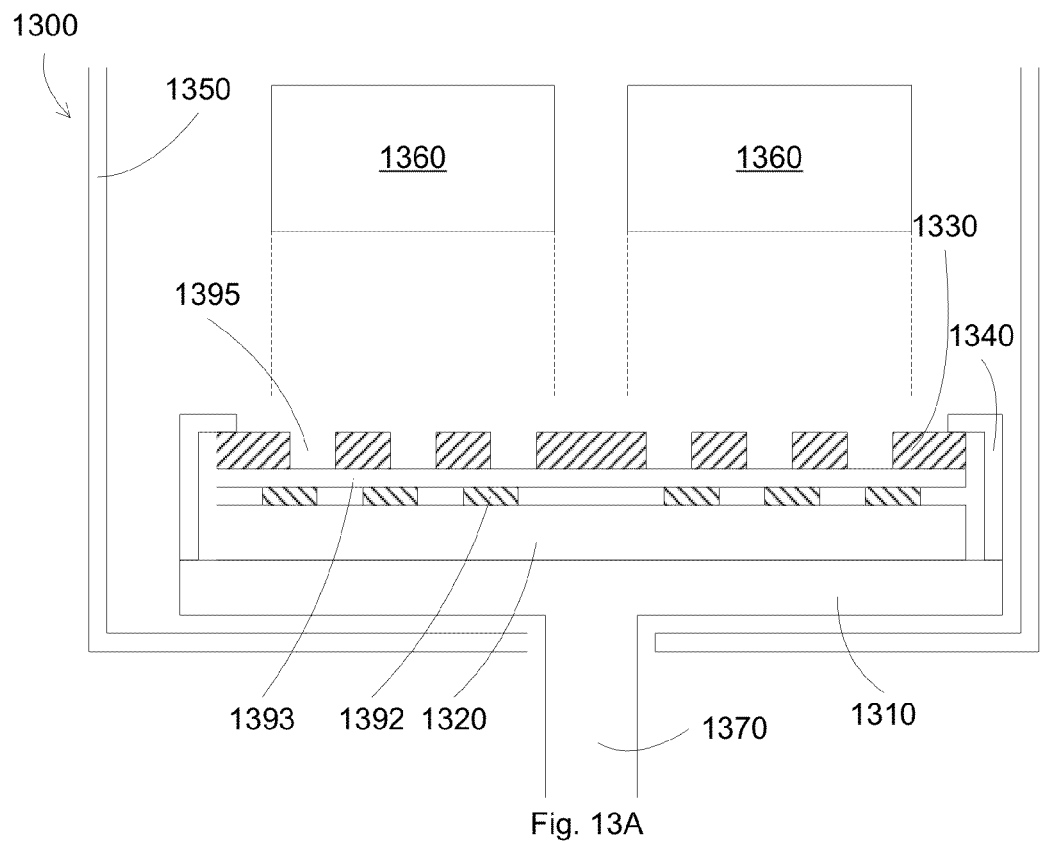
FIG. 13A illustrates a simplified schematic diagram of a reaction chamber in a combinatorial processing tool according to some embodiments of the present invention.

FIG. 13A illustrates a simplified schematic diagram of a reaction chamber 1300 in a combinatorial processing tool according to some embodiments of the present invention. In one implementation, the reaction chamber 1300 may include a substrate support 1310, a substrate 1320, a shadow mask 1330, clamps 1340, side walls 1350, process heads 1360, and an axle 1370.

The substrate support 1310 may be any device on which semiconductor or combinatorial processes may be performed, such as an electrostatic chuck or other type of chuck capable of holding the substrate 1320. In one implementation, the substrate support 1310 may be referred to as a carrier plate or pedestal. The substrate 1320 may be a semiconductor wafer, a portion of a semiconductor wafer, solar photovoltaic circuitry, or other semiconductor substrate. The substrate 1320 may also be referred to as a coupon, which may be a diced portion of a wafer. The coupon or substrate 1320 may contain one die, multiple dies (connected or not through the scribe), or a portion of a die with useable test structures. The individual dies on the substrate 1320 may be made from different materials. In some implementations, multiple coupons or dies can be diced from a single wafer and processed combinatorially.

The shadow mask 1330 may be attached to the substrate support 1320 with one or more clamps 1340. The clamps 1340 may be used to secure the substrate 1320 to the shadow mask 1330.

The substrate support 1310 may be positioned between the side walls 1350. In one implementation, the side walls 1350 may be plasma shields configured to keep plasma inside the reactor chamber 1300. The axle 1370 may be coupled to the substrate support 1310. In one implementation, the axle 1370 may be capable of lifting the substrate support 1310 in the upward or downward direction. In one implementation, the axle 1370 may be able to rotate 360 degrees clockwise or counterclockwise.

One or more process heads 1360 may be positioned above the substrate support 1310. In one implementation, the process heads 1360 may include deposition guns, such as PVD guns and the like. Although the reactor chamber 1300 is illustrated as having two process heads 1360 installed thereon, it should be understood that the reactor chamber 1300 may include a plurality of process heads 1360 which may be referred to as a cluster of process heads. In one implementation, the process heads 1360 may be capable of rotating 360 degrees clockwise or counterclockwise. In another implementation, the reactor 1300 may include one process head 1360, which can be moved to process different portions of the substrate 1320.

The shadow mask 1330 may be coupled to the substrate 1320 using clamps 1340. In one implementation, the clamps 1340 may be screws that may fasten through holes that may exist in the shadow mask 1330 and the substrate support 1310. The holes may align such that a screw or fastener may couple the shadow mask with the substrate support.

Figure 13B:
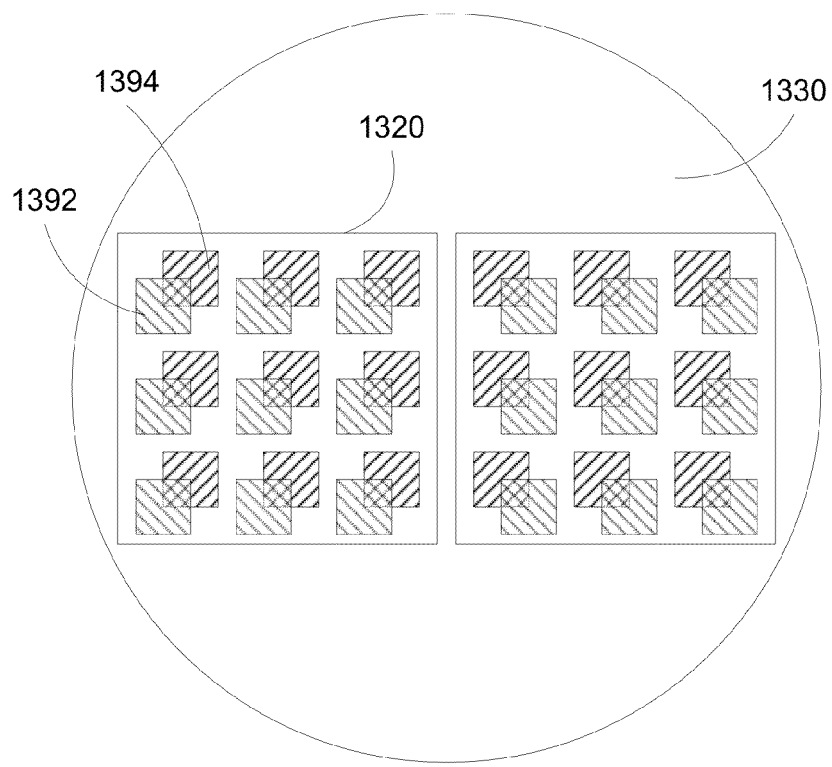
FIG. 13B illustrates a top view of a shadow mask for patterned depositions according to some embodiments of the present invention.

FIG. 13B illustrates a top view of a shadow mask 1330 for patterned depositions according to some embodiments of the present invention. In one implementation, the shadow mask 1330 may match the shape of the substrate. The shadow mask 1330 may contain one or more cutouts 520 such that the cutouts 520 may be in the shape of a die that exist on the substrate.

Inside the cutouts 520, the shadow mask 1330 may include one or more patterns 1395A which may exist as apertures on the shadow mask. In one implementation, the apertures may be laser drilled using photolithography (by spinning resist on the backside of the membrane) followed by wet etching, Deep-reactive Ion Etching (DRIE), Focused Ion Beam (FIB), or the like. Such techniques may allow small features to be patterned while maintaining a good distance alignment between the features on the substrate sized shadow mask.

FIGS. 13A and 13B illustrate substrate 1320 already having bottom electrodes 1392 and dielectric layer 1393 fabricated thereon. The substrate 1320 is shown ready to receive a top electrode deposition process using the shadow mask 1330 arranged to have the top electrode pattern. Similar fabrication process can be used to process the bottom electrode pattern, either by processing the substrate portion by portion or by processing the whole substrate in one pass.

In some embodiments, the present invention discloses a workpiece, such as a semiconductor wafer, having a substrate comprising multiple site isolated regions for capacitor structures with dual shadow masks. The site isolated region can comprise a dielectric layer sandwiched between a bottom electrode patterned layer comprising one or more bottom electrodes and a top electrode patterned layer comprising one or more top electrodes, wherein at least a top electrode of the one or more top electrodes and a bottom electrode of the one or more bottom electrodes overlap to form a capacitor structure comprising an overlapped dielectric area. The dielectric layer can be varied in a combinatorial manner in the multiple site isolated regions. In some embodiments, the top electrodes and the bottom electrodes overlap to form capacitor structures having overlapped dielectric areas of different sizes. The overlapped dielectric area is preferably smaller than the top electrode area or the bottom electrode area, such as less than 10 microns. The top electrode patterned layer can have a probe pattern for automatic probing. The top and bottom patterned electrode layers can have a same pattern that is shifted.

Figure 14A:
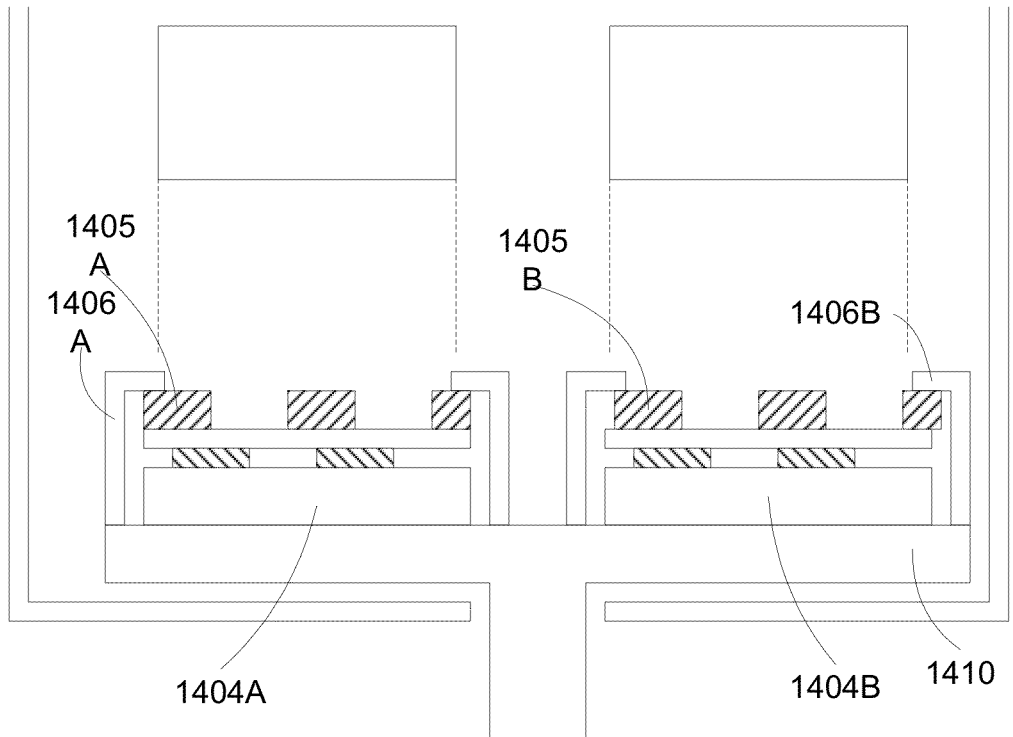
FIGS. 14A and 14B illustrate another simplified schematic diagram of a reaction chamber in a combinatorial processing tool according to some embodiments of the present invention.
Figure 14B:
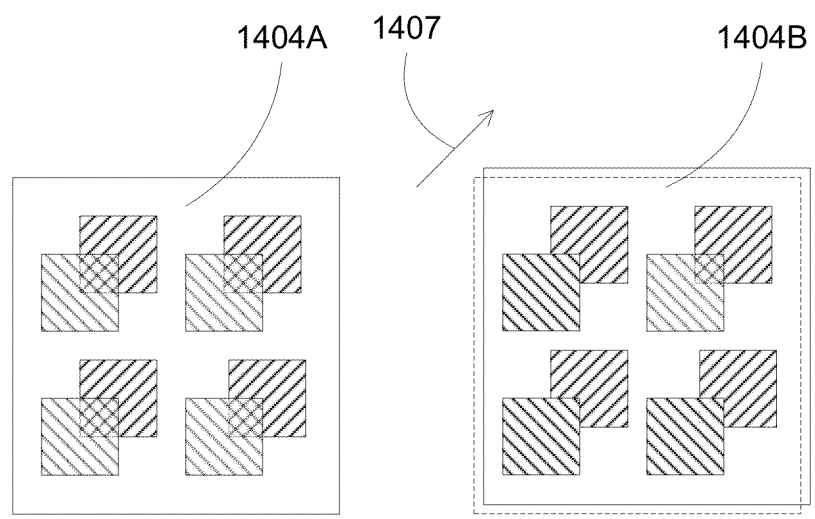

FIGS. 14A and 14B illustrate another simplified schematic diagram of a reaction chamber in a combinatorial processing tool according to some embodiments of the present invention. A substrate is separated into multiple portions 1404A and 1404B, which are mounted on different locations on the substrate support 1410 through clamps 1406A and 1406B, respectively. The substrate portions 1404A and 1404B can be processed in parallel by multiple process heads, or in series by a single process head moving between portions.

In some embodiments, the shadow masks 1405A and 1405B for the substrate portions 1404A and 1404B can be rotational or translational shifted with respect to each other, or with respect to the bottom electrode pattern. Different effective capacitor sizes can be achieved for different substrate portions through the shifting of the shadow masks. As shown in FIG. 10B, shadow mask 1405B is translational shifted 1407, achieving smaller overlap areas between the top and bottom electrodes in the substrate portion 1404B as compared to the substrate portion 1404A.

In some embodiment, the shadow mask is coupled to a deposition head that moves to deposit the top conductive material on different isolated regions on the substrate through the coupled second shadow mask.

Figure 15A:
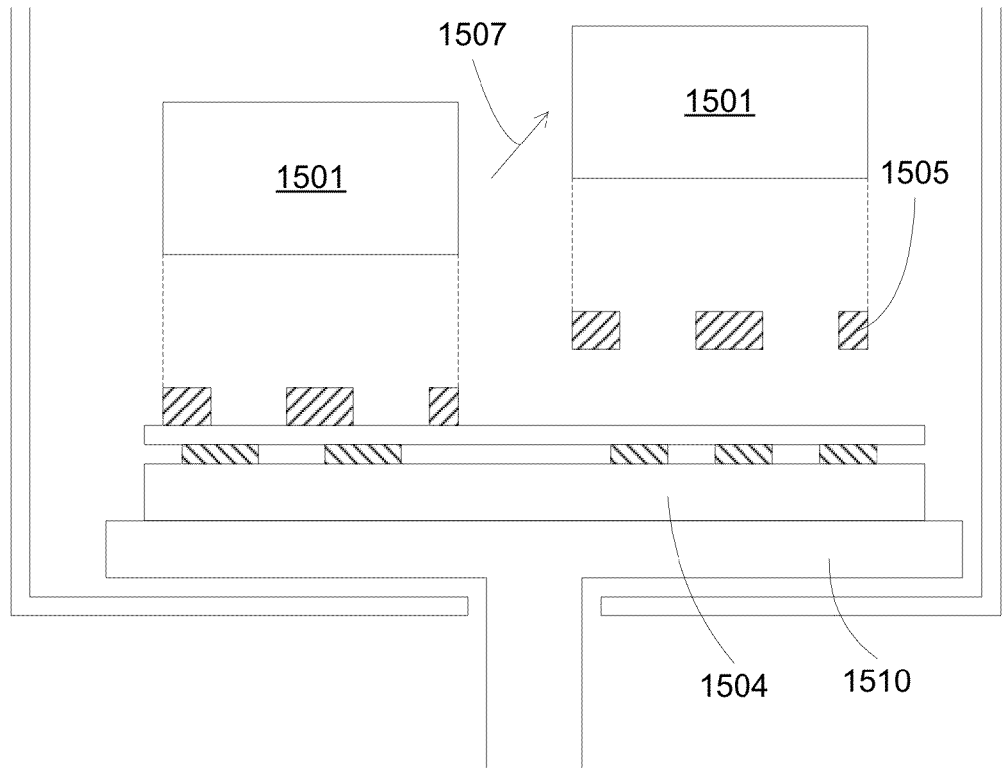
FIGS. 15A and 15B illustrate another simplified schematic diagram of a reaction chamber in a combinatorial processing tool according to some embodiments of the present invention.
Figure 15B:
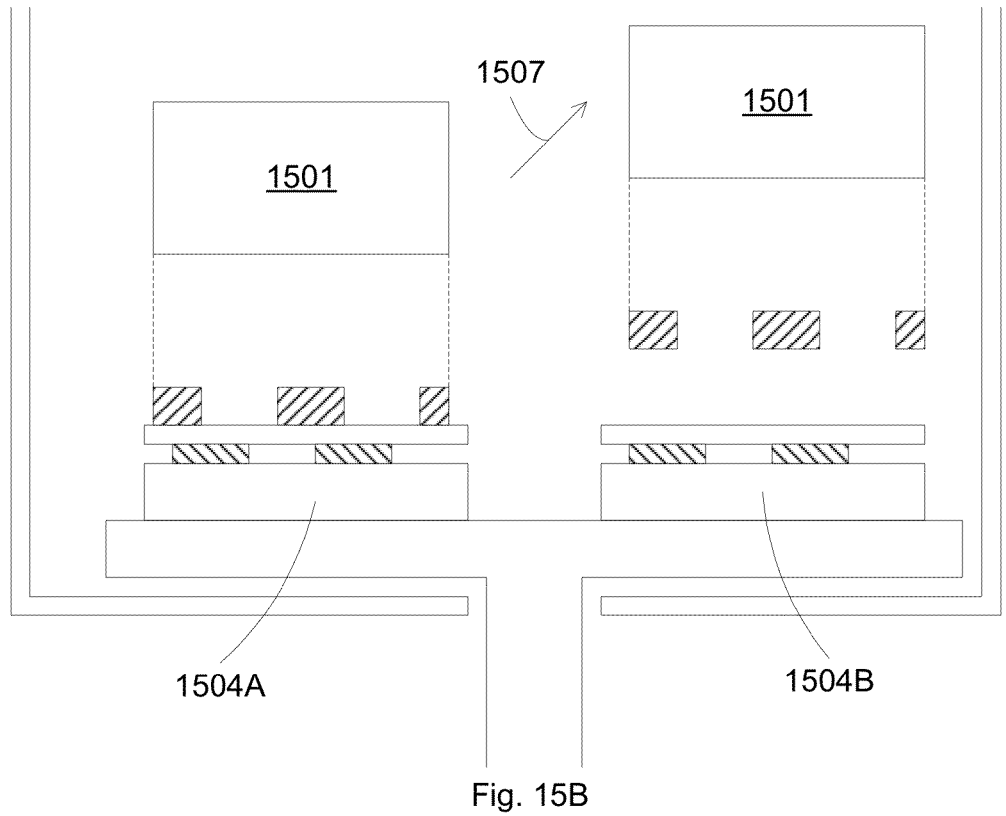

FIGS. 15A and 15B illustrate another simplified schematic diagram of a reaction chamber in a combinatorial processing tool according to some embodiments of the present invention. Shadow mask 1505 is attached to the process head 1501 which can move 1507 to process different portions of the substrate. Alternatively, a large process head can be used to process the whole substrate in one pass. Multiple process heads can also be used to process different substrate portions in parallel. A whole substrate 1504, or multiple substrate portions 1504A-1504B can be mounted on substrate support 1510.

For deposition, process head 1501 is brought down so that the shadow mask is in contact with the substrate area before deposition starts. After completing deposition, the process head is lifted up, and move to another substrate portion to process the another substrate portion. Flexible membrane, such as a bellows coupling the shadow mask 1505 to the process head 1501, can allow good contact of the shadow mask to the substrate.

On a 300 mm Si wafer, the dual shadow-mask approach can be combined with multiple dielectric depositions with different dielectric thickness or process conditions to achieve a true High Productivity Combinatorial (HPC) method for material screening. This approach can be used for DRAM capacitor, ReRAM or any other application where MIMCAP dielectrics need to be optimized.

Figure 16A:
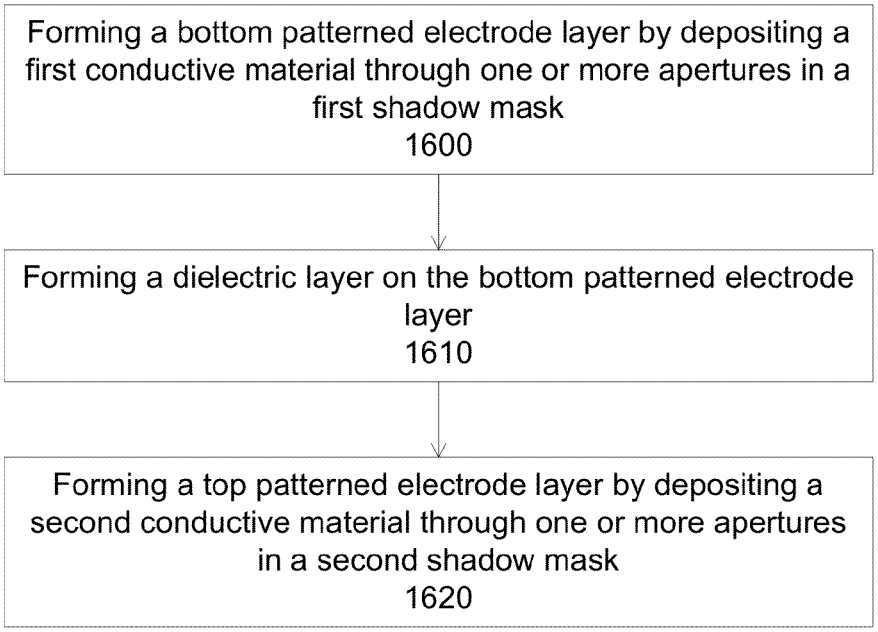
FIGS. 16A-16B illustrate exemplary flowcharts for forming capacitor structures using dual shadow masks according to some embodiments of the present invention.
Figure 16B:
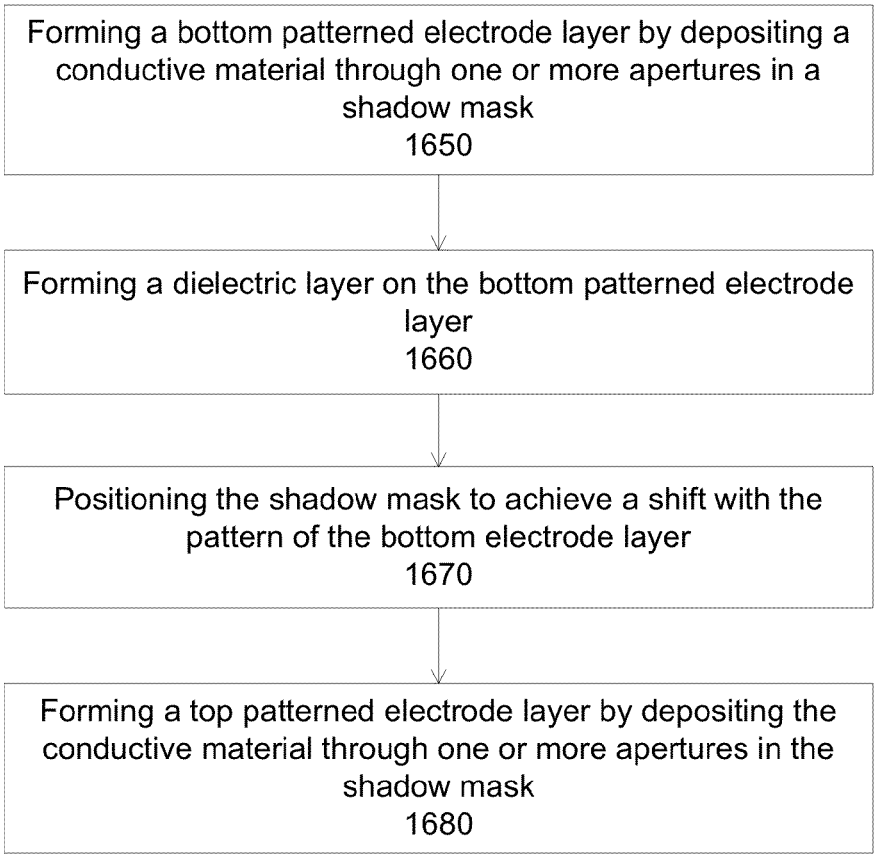

FIGS. 16A-16B illustrate exemplary flowcharts for forming capacitor structures using dual shadow masks according to some embodiments of the present invention. FIG. 16A shows a process using two shadow masks, and FIG. 16B shows a process for a same shadow mask, or for shadow masks have a same aperture pattern. In FIG. 16A, operation 1600 forms a bottom patterned electrode layer by depositing a first conductive material on a substrate through one or more apertures in a first shadow mask. The substrate can be a whole, a portion, or multiple portions of a semiconductor substrate. The deposition can be a whole substrate deposition, or can be parallel or serial substrate portion depositions in HPC combinatory systems. Operation 1610 forms a dielectric layer on the bottom patterned electrode layer. The dielectric layer can be deposited on the whole substrate, or different substrate portions can have different dielectric layers, for example, dielectric layers having different materials, different thicknesses, or different process conditions. HPC system can process multiple substrate portions separately, enabling screening of large parameter matrix for optimization.

Operation 1620 forms a top patterned electrode layer by depositing a second conductive material on the substrate through one or more apertures in a second shadow mask. The substrate can be a whole, a portion, or multiple portions of a semiconductor substrate. The deposition can be a whole substrate deposition, or can be parallel or serial substrate portion depositions in HPC combinatory systems. Similar or different second shadow masks can be used for different substrate portions to provide similar or different capacitor structures, respectively.

In FIG. 16B, the first and second shadow masks have a same aperture pattern. Alternatively, a same shadow mask can be used for the deposition of top and bottom electrode layers. Operation 1650 forms a bottom patterned electrode layer by depositing a conductive material on a substrate through one or more apertures in a shadow mask. Operation 1660 forms a dielectric layer on the bottom patterned electrode layer.

Operation 1670 positions the shadow mask on the substrate to achieve a shift with the pattern of the bottom electrode layer. The shift can be a rotational shift or a translational shift. Multiple substrates can be used with increasing shifting amounts. Operation 1680 forms a top patterned electrode layer by depositing the conductive material on the substrate through the shadow mask.

Figure 17:
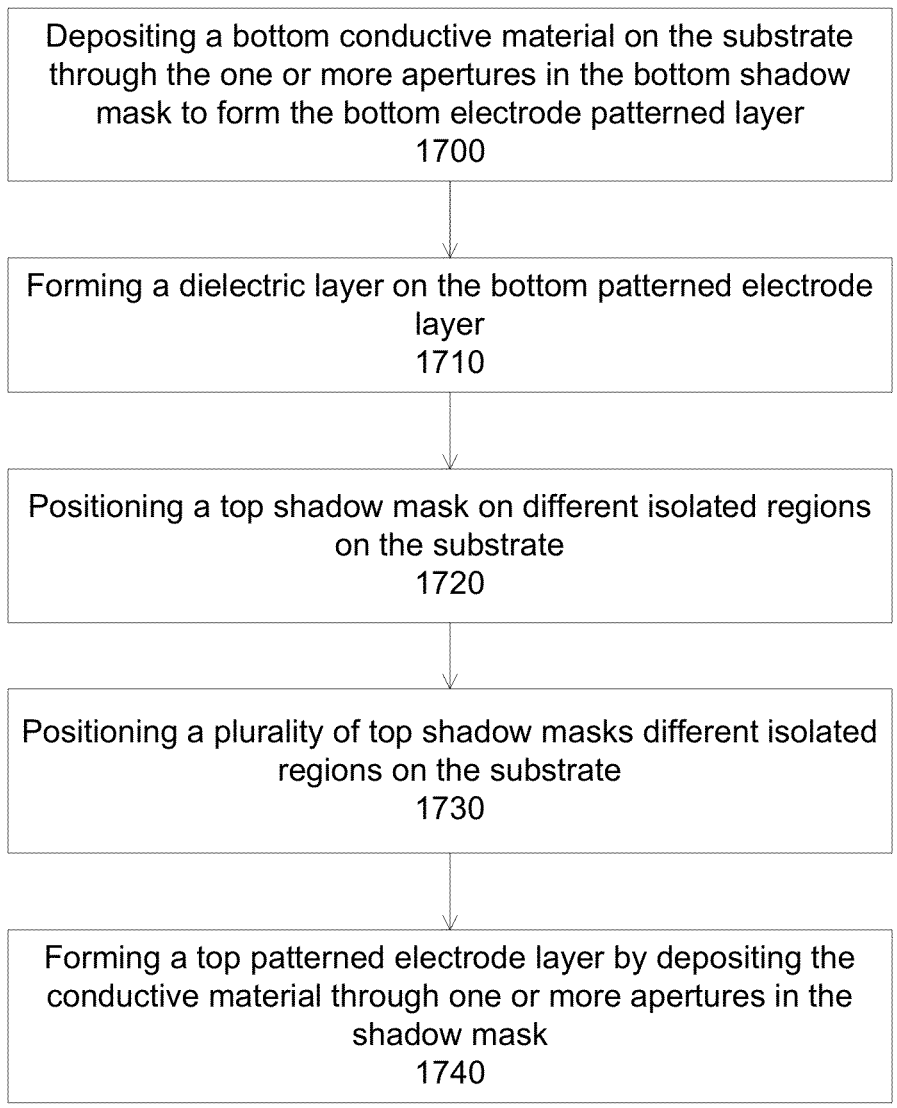
FIG. 17 illustrates an exemplary flowchart for forming capacitor structures using dual shadow masks in a combinatory system according to some embodiments of the present invention.

FIG. 17 illustrates an exemplary flowchart for forming capacitor structures using dual shadow masks in a combinatory system according to some embodiments of the present invention. A substrate with a bottom electrode pattern is first produced with a bottom shadow mask. Operation 1700 deposits a bottom conductive material on the substrate through the one or more apertures in the bottom shadow mask to form the bottom electrode patterned layer. Operation 1710 forms a dielectric layer on the bottom patterned electrode layer. These two operations can be performed in conventional whole substrate processing system, or in combinatory system.

After producing a substrate having a bottom electrode pattern with a dielectric layer, the substrate is processed in a combinatory system, for example, to enable a quick and cost effective comparison of different material and process conditions. In the combinatory system, the substrate is separately processed by different portions, either parallelly through multiple process heads or serially through movements of a single process head. The different portions can be processingly separated, e.g., the substrate is still intact with different areas having different process conditions. The different portions can be physically separated, e.g., the substrate is broken into multiple pieces, and then mounted in separate locations on a substrate support.

Operation 1720 provides for serial combinatory processing with a shadow mask coupled to the process head, comprising positioning a second shadow mask on different isolated regions on the substrate before forming a top electrode layer through the second shadow mask (operation 1740). The second shadow mask can produce different overlapping patterns on different substrate portion, for example, achieved by first aligning the process head with the bottom electrode pattern and then progressively shifting the process head with respect to the bottom electrode pattern.

Operation 1739 provides for serial or parallel combinatory processing with multiple shadow mask attached to the multiple substrate portions. The shadow masks can be progressively shifted to achieve different overlapping patterns. A top electrode layer is deposited through the multiple shadow masks (operation 1740).

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming capacitor structures on a substrate in a combinatorial manner, comprising:
   depositing a bottom patterned electrode layer on the substrate by depositing a bottom conductive material through one or more apertures in a first shadow mask, the bottom patterned electrode layer comprising bottom electrodes;
   defining site isolated regions on the bottom patterned electrode layer;
   depositing a dielectric layer on each of the site isolated regions, wherein at least one property of the dielectric layer is varied in a combinatorial manner among the dielectric layers in each region;
   and depositing a top patterned electrode layer on the dielectric layer by depositing a top conductive material through apertures in a second shadow mask, the top patterned electrode layer comprising multiple top electrodes;
   wherein the multiple top electrodes and multiple bottom electrodes overlap to form multiple capacitor structures;
   wherein each of the multiple capacitor structures comprises an interstitial dielectric area;
   and wherein the interstitial dielectric areas of the multiple capacitor structures have different sizes.

2. The method of claim 1 further comprising:
   securing the first shadow mask on the substrate before depositing the bottom conductive material.

3. The method of claim 1 further comprising:
   securing the second shadow mask on the substrate before depositing the top conductive material.

4. The method of claim 1 wherein the first and second shadow masks are a same shadow mask, the method further comprising positioning the second shadow mask on the dielectric layer to achieve a shift between the patterns of the top and bottom patterned electrode layers,
   wherein the shadow mask is configured to form interstitial dielectric areas of different sizes when shifting.

5. The method of claim 1 wherein the interstitial dielectric area is smaller than the top electrode area or the bottom electrode area.

6. The method of claim 1 wherein varying at least one property of the dielectric layer in a combinatorial manner comprises varying a dielectric layer thickness or a dielectric layer material.

7. The method of claim 1 wherein varying the top patterned electrode layer in a combinatorial manner comprises varying an interstitial dielectric area.

8. The method of claim 1 wherein the second shadow mask is coupled to a deposition source that moves to deposit the top conductive material on different isolated regions on the substrate through the coupled second shadow mask.

9. A method for forming capacitor structures on a substrate in a combinatorial manner, comprising:
   depositing a bottom patterned electrode layer on the substrate by depositing a bottom conductive material through one or more apertures in a first shadow mask, the bottom patterned electrode layer comprising bottom electrodes;
   defining site isolated regions on the bottom patterned electrode layer;
   depositing a dielectric layer on each of the site isolated regions, wherein at least one property of the dielectric layer is varied in a combinatorial manner;
   singulating the substrate into multiple substrate pieces;
   positioning multiple second shadow masks on the multiple substrate pieces;
   depositing a top patterned electrode layer on the multiple substrate pieces by depositing a top conductive material through one or more apertures in the second shadow masks, the top patterned electrode layer comprising top electrodes;
   wherein at least a top electrode and a bottom electrode overlap to form a capacitor structure comprising an interstitial dielectric area.

10. The method of claim 9 wherein the multiple second masks are positioned to vary an interstitial dielectric area in a combinatorial manner.

11. The method of claim 9 wherein the interstitial dielectric area is smaller than the top electrode area or the bottom electrode area.

12. The method of claim 9 wherein varying at least one property of the dielectric layer in a combinatorial manner comprises varying a dielectric layer thickness or a dielectric layer material.

* * * * *